United States Patent
Endo

(10) Patent No.: US 9,978,879 B2
(45) Date of Patent: May 22, 2018

(54) SEMICONDUCTOR DEVICE

(71) Applicant: Semiconductor Energy Laboratory Co., Ltd., Atsugi-shi, Kanagawa-ken (JP)

(72) Inventor: Yuta Endo, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days. days.

(21) Appl. No.: 15/685,040

(22) Filed: Aug. 24, 2017

(65) Prior Publication Data

US 2018/0061989 A1    Mar. 1, 2018

(30) Foreign Application Priority Data

Aug. 31, 2016    (JP) .................................. 2016-169448

(51) Int. Cl.
| | |
|---|---|
| *H01L 29/786* | (2006.01) |
| *H01L 29/10* | (2006.01) |
| *H01L 27/088* | (2006.01) |
| *H01L 21/8234* | (2006.01) |

(52) U.S. Cl.
CPC .. *H01L 29/7869* (2013.01); *H01L 21/823412* (2013.01); *H01L 27/088* (2013.01); *H01L 29/1033* (2013.01)

(58) Field of Classification Search
CPC ......... H01L 29/7869; H01L 21/823412; H01L 27/088
See application file for complete search history.

(56) References Cited

U.S. PATENT DOCUMENTS

| | | | |
|---|---|---|---|
| 7,674,650 B2 | 3/2010 | Akimoto et al. | |
| 8,384,080 B2 | 2/2013 | Taniguchi et al. | |
| 8,692,252 B2 | 4/2014 | Takata et al. | |
| 8,737,109 B2 | 5/2014 | Yamazaki et al. | |
| 8,860,108 B2 | 10/2014 | Yamazaki et al. | |
| 8,947,158 B2 | 2/2015 | Watanabe | |
| 9,024,317 B2 | 5/2015 | Endo et al. | |
| 9,337,826 B2 | 5/2016 | Koyama et al. | |
| 9,425,217 B2 * | 8/2016 | Ishihara | ............... H01L 27/1225 |

(Continued)

FOREIGN PATENT DOCUMENTS

| | | |
|---|---|---|
| JP | 2007-096055 A | 4/2007 |
| JP | 2007-123861 A | 5/2007 |
| JP | 2011-119674 A | 6/2011 |

*Primary Examiner* — Errol Fernandes
(74) *Attorney, Agent, or Firm* — Fish & Richardson P.C.

(57) ABSTRACT

A high-performance semiconductor device with high reliability is provided. The semiconductor device includes a first transistor, a second transistor, a first metal oxide covering at least part of the first transistor, an insulating film over the first transistor and the second transistor, and a second metal oxide over the insulating film. The first transistor includes a first gate electrode, a first gate insulating film, a first oxide, a first source electrode, a first drain electrode, a second gate insulating film, and a second gate electrode. The second transistor includes a third gate electrode, a third gate insulating film, a second oxide, a second source electrode, a second drain electrode, a fourth gate insulating film, and a fourth gate electrode. The first gate insulating film and the second gate insulating film are in contact with the first metal oxide.

20 Claims, 23 Drawing Sheets

(56) References Cited

U.S. PATENT DOCUMENTS

| | | | |
|---|---|---|---|
| 9,722,092 B2* | 8/2017 | Noda | H01L 29/7869 |
| 9,842,937 B2* | 12/2017 | Yamazaki | H01L 29/7869 |
| 2010/0025675 A1* | 2/2010 | Yamazaki | H01L 27/1225 |
| | | | 257/43 |
| 2012/0248433 A1* | 10/2012 | Nakano | H01L 29/4908 |
| | | | 257/43 |
| 2013/0161610 A1* | 6/2013 | Yamazaki | H01L 29/7869 |
| | | | 257/43 |
| 2015/0053978 A1* | 2/2015 | Yamazaki | H01L 27/1225 |
| | | | 257/43 |
| 2017/0263650 A1 | 9/2017 | Tochibayashi et al. | |
| 2017/0263651 A1 | 9/2017 | Tochibayashi et al. | |
| 2017/0271517 A1 | 9/2017 | Kimura et al. | |
| 2017/0294541 A1 | 10/2017 | Yamazaki | |
| 2017/0309732 A1 | 10/2017 | Yamazaki et al. | |
| 2017/0309752 A1 | 10/2017 | Yamazaki et al. | |

* cited by examiner

SEMICONDUCTOR DEVICE

BACKGROUND OF THE INVENTION

1. Field of the Invention

Embodiments of the present invention relate to a semiconductor device and a method for driving the semiconductor device. Another embodiment of the present invention relates to an electronic device.

In this specification and the like, a semiconductor device refers to every device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

2. Description of the Related Art

A technique by which a transistor is formed using a semiconductor thin film has been attracting attention. The transistor is used in a wide range of electronic devices such as an integrated circuit (IC) and an image display device (also simply referred to as a display device). Silicon-based semiconductor materials are widely known as materials for semiconductor thin films that can be used for transistors. As other materials, oxide semiconductors have been attracting attention.

For example, techniques have been disclosed by each of which a display device is manufactured using a transistor whose active layer is formed of zinc oxide or an In—Ga—Zn-based oxide as an oxide semiconductor (see Patent Documents 1 and 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

SUMMARY OF THE INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

A semiconductor device includes, over one substrate, a circuit formed using transistors of various shapes and a circuit in which transistors are densely provided, in some cases. For example, transistors of various shapes may have different channel lengths (L) and/or different channel widths (W), different gate electrode widths, different gate electrode thicknesses, or the like. The density at which transistors are provided refers to the number of transistors provided per unit area. For example, in the case where the transistor density refers to the number of transistors provided per square micrometer, the transistor density can be expressed in the unit/$\mu m^2$ or $\cdot \mu m^{-2}$.

In the circuit formed using transistors of various shapes, the transistors might have different electrical characteristics due to their various shapes. In the circuit in which transistors are densely provided, variation in the electrical characteristics of the transistors might be large.

According to one embodiment of the present invention, a semiconductor device including two or more kinds of transistors with different structures can be provided. In other words, by forming a transistor in a circuit to have a structure different from a structure of a transistor in another circuit, variation in the electrical characteristics of the transistors included in the respective circuits can be suppressed, and thus, a high-performance semiconductor device can be provided. Typically, a semiconductor device includes a first circuit including a first transistor and a second circuit including a second transistor, the first transistor is covered with a metal oxide, typified by aluminum oxide, which has a function of inhibiting the passage of oxygen, and the second transistor is covered with an insulator that includes excess oxygen.

One embodiment of the present invention is a semiconductor device including a first transistor, a second transistor, a first metal oxide covering at least part of the first transistor, an insulating film over the first transistor and the second transistor, and a second metal oxide over the insulating film. The first transistor includes a first gate electrode, a first gate insulating film over the first gate electrode, a first oxide over the first gate insulating film, a first source electrode and a first drain electrode that are electrically connected to the first oxide, a second gate insulating film over the first oxide, and a second gate electrode over the second gate insulating film. The second transistor includes a third gate electrode, a third gate insulating film over the third gate electrode, a second oxide over the third gate insulating film, a second source electrode and a second drain electrode that are electrically connected to the second oxide, a fourth gate insulating film over the second oxide, and a fourth gate electrode over the fourth gate insulating film. The first gate insulating film and the second gate insulating film are in contact with the first metal oxide. The third gate insulating film and the fourth gate insulating film are in contact with the insulating film. The insulating film includes excess oxygen.

Another embodiment of the present invention is a semiconductor device including a first transistor, a second transistor, a first metal oxide covering at least part of the first transistor and part of the second transistor, an insulating film over the first transistor and the second transistor, and a second metal oxide over the insulating film. The first transistor includes a first gate electrode, a first gate insulating film over the first gate electrode, a first oxide over the first gate insulating film, a first source electrode and a first drain electrode that are electrically connected to the first oxide, a second gate insulating film over the first oxide, and a second gate electrode over the second gate insulating film. The second transistor includes a third gate electrode, a third gate insulating film over the third gate electrode, a second oxide over the third gate insulating film, a second source electrode and a second drain electrode that are electrically connected to the second oxide, a fourth gate insulating film over the second oxide, and a fourth gate electrode over the fourth gate insulating film. The first gate insulating film is in contact with the insulating film. The second gate insulating film is in contact with the first metal oxide and the insulating film. The third gate insulating film and the fourth gate insulating film are in contact with the insulating film. The insulating film includes excess oxygen.

The first metal oxide may have a function of inhibiting the passage of oxygen.

The first metal oxide and the second metal oxide may each include aluminum and oxygen.

The semiconductor device of one embodiment of the present invention may include a first circuit and a second circuit. The first circuit may include a plurality of first transistors and the second circuit may include a plurality of second transistors.

In the semiconductor device, the channel width of each of the plurality of first transistors included in the first circuit may be twice or more and 1000 times or less the channel length of each of the plurality of first transistors.

In the semiconductor device, the channel length of each of the plurality of first transistors included in the first circuit may be twice or more and 1000 times or less the channel width of each of the plurality of first transistors.

In the semiconductor device, the density of the plurality of second transistors included in the second circuit may be higher than or equal to $0.01/\mu m^2$ and lower than or equal to $2500/\mu m^2$.

In the semiconductor device, the density of the plurality of first transistors included in the first circuit may be lower than the density of the plurality of second transistors included in the second circuit.

In the semiconductor device, the channel width of each of the plurality of first transistors included in the first circuit may be larger than the channel width of each of the plurality of second transistors included in the second circuit.

In the semiconductor device, the channel length of each of the plurality of first transistors included in the first circuit may be longer than the channel length of each of the plurality of second transistors included in the second circuit.

A semiconductor device having favorable electrical characteristics can be provided. A semiconductor device that can be miniaturized or highly integrated can be provided. A semiconductor device that can be manufactured with high productivity can be provided.

A semiconductor device capable of retaining data for a long time can be provided. A semiconductor device capable of high-speed data writing can be provided. A semiconductor device with high design flexibility can be provided. A semiconductor device capable of reducing power consumption can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

DETAILED DESCRIPTION OF THE INVENTION

Figure 1A:
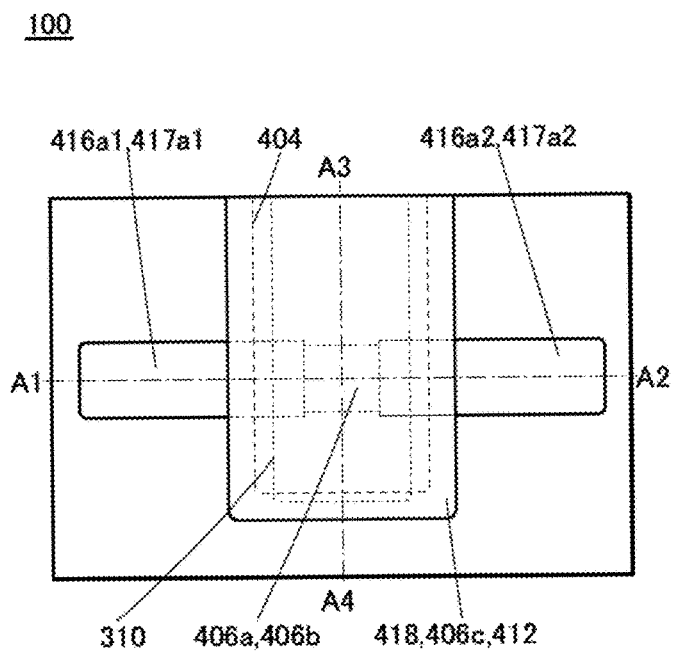
FIGS. 1A to 1C are a top view and cross-sectional views illustrating a structure of a transistor of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. In addition, the same hatching pattern is applied to portions having similar functions, and the portions are not particularly denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relation between components is changed as appropriate in accordance with the direction in which each component is described. Thus, there is no limitation on terms used in this specification, and description can be made appropriately depending on the situation.

The "semiconductor device" in this specification and the like means every device which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, the functions of a source and a drain might be interchanged with each other when transistors having different polarities are employed or the direction of current flow is changed in circuit operation, for example. Therefore, the terms "source" and "drain" can be interchanged with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relation, for example, the connection relation shown in drawings or texts, another connection relation is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit and a step-down circuit) and a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; and a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

According to one embodiment of the present invention, transistors 100 with different sizes in a circuit have different structures from transistors 200 provided at a high density in another circuit, whereby variation in the electrical characteristics of the transistors included in each circuit can be suppressed and a high-performance semiconductor device can be provided. In this embodiment, an example of an embodiment in which the transistors 100 with different sizes in the circuit and the transistors 200 provided at a high density in the circuit are formed over one substrate is described.

<Structure Example 1 of Transistor>

Structures of the transistors 100 and 200 of embodiments of the present invention are described below.

Figure 1C:
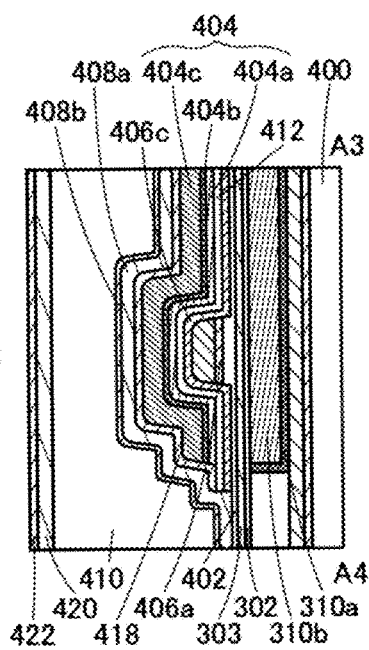
Figure 1B:
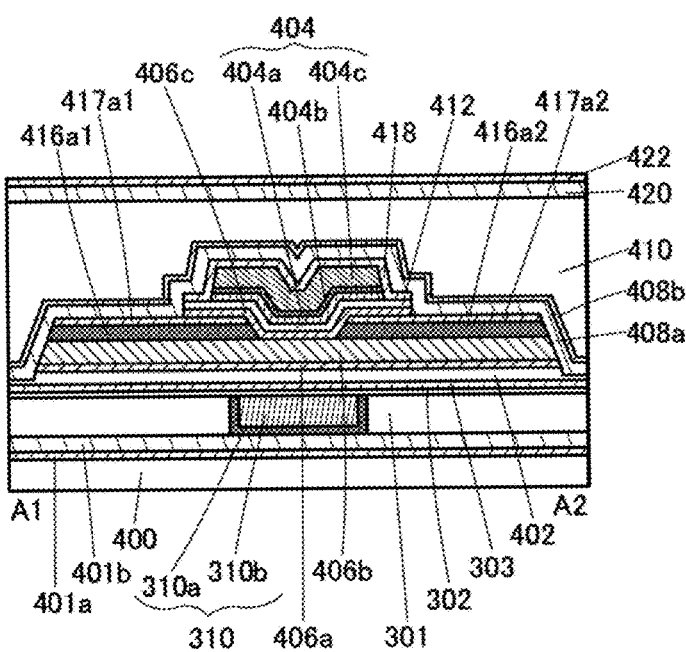

FIG. 1A is a top view of the transistor 100. FIG. 1B is a cross-sectional view taken along dashed-dotted line A1-A2 in FIG. 1A. FIG. 1C is a cross-sectional view taken along dashed-dotted line A3-A4 in FIG. 1A. In FIG. 1B, the cross-sectional view along A1-A2 is taken in the channel length direction of the transistor 100. In FIG. 1C, the cross-sectional view along A3-A4 is taken in the channel width direction of the transistor 100. Note that for simplification of the drawing, some components in the top view in FIG. 1A are not illustrated.

In FIGS. 1B and 1C, the transistor 100 is provided over an oxide 401a over a substrate 400 and an oxide 401b over the oxide 401a. The transistor 100 includes a conductor 310a, a conductor 310b, and an insulator 301 over the oxide 401b; an insulator 302 over the conductor 310a, the conductor 310b, and the insulator 301; an insulator 303 over the insulator 302; an insulator 402 over the insulator 303; an oxide 406a over the insulator 402; an oxide 406b over the oxide 406a; a conductor 416a1 and a conductor 416a2 each including a region in contact with a top surface of the oxide 406b; a barrier film 417a1 over the conductor 416a1; a barrier film 417a2 over the conductor 416a2; an oxide 406c including a region in contact with a side surface of the conductor 416a1, a side surface of the conductor 416a2, a side surface of the barrier film 417a1, a side surface of the barrier film 417a2, and a top surface of the oxide 406b; an insulator 412 over the oxide 406c; and a conductor 404 including a region overlapping with the top surface of the oxide 406b with the oxide 406c and the insulator 412 therebetween. The insulator 301 has an opening, and the conductor 310a and the conductor 310b are provided in the opening.

Over the transistor 100, an oxide 418, an oxide 408a over the oxide 418, an oxide 408b over the oxide 408a, an insulator 410 over the oxide 408b, an oxide 420 over the insulator 410, and an oxide 422 over the oxide 420 are provided.

In the cross-sectional view in the channel length direction in FIG. 1B, end portions of the oxide 418, end portions of the insulator 412, and end portions of the oxide 406c are aligned and positioned over the barrier film 417a1 and the barrier film 417a2. In the cross-sectional view in the channel width direction in FIG. 1C, an end portion of the oxide 418, an end portion of the insulator 412, and an end portion of the oxide 406c are aligned and positioned over the insulator 402. The oxide 408a includes a region in contact with a side surface of the oxide 406a, a side surface of the oxide 406b, and a top surface of the insulator 402.

In the transistor 100, the conductor 404 functions as a first gate electrode. The conductor 404 can have a stacked-layer structure including a conductor 404a, a conductor 404b, and a conductor 404c. For example, when the conductor 404a or the conductor 404b having a function of inhibiting the passage of oxygen is formed under the conductor 404c, an increase in the electric resistance value due to oxidation of the conductor 404c can be prevented. The insulator 412 functions as a first gate insulator.

The conductors 416a1 and 416a2 function as a source electrode and a drain electrode of the transistor. The conductors 416a1 and 416a2 can each have a stacked-layer structure including a conductor having a function of inhibiting the passage of oxygen. For example, when a conductor having a function of inhibiting the passage of oxygen is formed as an upper layer, an increase in the electric resistance value due to oxidation of the conductors 416a1 and 416a2 can be prevented. Note that the electric resistance values of the conductors can be measured by a two-terminal method or the like.

The barrier films 417a1 and 417a2 each have a function of inhibiting the passage of oxygen and impurities such as hydrogen and water. The barrier film 417a1 is located over the conductor 416a1 and prevents diffusion of oxygen into the conductor 416a1. The barrier film 417a2 is located over the conductor 416a2 and prevents diffusion of oxygen into the conductor 416a2.

In the transistor 100, the oxide 406b serves as a channel formation region. That is, in the transistor 100, the resistance of the oxide 406b can be controlled by a potential applied to the conductor 404. In other words, conduction or non-conduction between the conductor 416a1 and the conductor 416a2 can be controlled by the potential applied to the conductor 404.

As illustrated in FIG. 1C, the oxide 406c is provided so as to cover the whole oxide 406b. Furthermore, the conductor 404 functioning as the first gate electrode is provided so as to cover the whole oxide 406b with the insulator 412 functioning as the first gate insulator therebetween. Thus, the whole oxide 406b can be electrically surrounded by an electric field of the conductor 404 functioning as the first gate electrode. Such a transistor structure in which a channel formation region is electrically surrounded by an electric field of a first gate electrode is referred to as a surrounded channel (s-channel) structure. As a result, a channel can be formed in the whole oxide 406b; thus, a large amount of current can flow between the source and the drain, and current in an on state (on-state current) can be increased. In addition, since the oxide 406b is surrounded by the electric field of the conductor 404, current in an off state (off-state current) can be decreased.

In the transistor, the conductor 404 functioning as a first gate electrode partly overlaps with each of the conductors 416a1 and 416a2 functioning as the source electrode and the drain electrode, whereby parasitic capacitance between the conductor 404 and the conductor 416a1 and parasitic capacitance between the conductor 404 and the conductor 416a2 are formed.

The transistor structure including the barrier film 417a1 as well as the insulator 412 and the oxide 406c between the conductor 404 and the conductor 416a1 allows a reduction in the parasitic capacitance. Similarly, the transistor structure including the barrier film 417a2 as well as the insulator 412 and the oxide 406c between the conductor 404 and the conductor 416a2 allows a reduction in the parasitic capacitance. Thus, the transistor has excellent frequency characteristics.

Furthermore, the above structure of the transistor allows a reduction or prevention of generation of a leakage current between the conductor 404 and each of the conductors 416a1 and 416a2 when the transistor operates, for example, when a potential difference between the conductor 404 and each of the conductors 416a1 and 416a2 occurs.

A conductor 310 (the conductor 310a and the conductor 310b) is provided in the opening formed in the insulator 301. The conductor 310a is formed in contact with an inner wall of the opening in the insulator 301, and the conductor 310b is formed on the inner side. Here, top surfaces of the conductors 310a and 310b can have substantially the same level as a top surface of the insulator 301. The conductor 310 functions as a second gate electrode. The conductor 310 can be a multilayer film including a conductor that has a function of inhibiting the passage of oxygen. For example, when the conductor 310a is formed using a conductor that has a function of inhibiting the passage of oxygen, a decrease in the conductivity due to oxidation of the conductor 310b can be prevented.

The insulator 302, the insulator 303, and the insulator 402 function as a second gate insulating film. By controlling a potential supplied to the conductor 310, the threshold voltage of the transistor can be adjusted.

Here, for the oxide 408a, a metal oxide that is formed by a sputtering method is preferably used, and for example, aluminum oxide is preferably used. Such an oxide 408a enables oxygen to be added to a surface at which the oxide 408a and the insulator 402 are in contact with each other, and thus, the insulator 402 can be brought into an oxygen excess state. The oxygen can be effectively supplied, by heat treatment or the like, to the oxide 406a and a region of the oxide 406b where a channel is formed (channel formation region) through the insulator 402. The oxygen is supplied to the oxide 406a and the oxide 406b in this manner, whereby oxygen vacancies in the oxide 406a and the oxide 406b can be reduced. Since the oxide 406a and the insulator 402 including excess oxygen are provided in contact with each other, oxygen can be supplied to the oxide 406a and the oxide 406b uniformly regardless of the size of a transistor. Thus, the transistor 100 can have favorable characteristics regardless of size.

In addition, when a metal oxide that has a function of inhibiting the passage of oxygen, such as aluminum oxide, is used for the oxide 408a, the oxygen added to the insulator 402 can be prevented from being diffused upward during deposition. Accordingly, oxygen can be added to the insulator 402 more efficiently. The oxide 408b may be provided over the oxide 408a. For the oxide 408b, a metal oxide that is formed by an atomic layer deposition (ALD) method is preferably used, and for example, aluminum oxide is preferably used. Since a film that is formed by an ALD method has an excellent coverage, the oxygen added to the insulator 402 can be further prevented from being diffused upward during deposition. The insulator 402 is formed using an insulating material that is more likely to transmit oxygen than the oxide 408a or the oxide 408b. For example, silicon oxide or silicon oxynitride can be used.

In this manner, variation in the electrical characteristics of transistors can be suppressed regardless of transistor size. The channel width of the transistor 100 is twice or more and 1000 times or less the channel length of the transistor 100. The channel length of the transistor 100 is twice or more and 1000 times or less the channel width of the transistor 100.

Figure 2A:
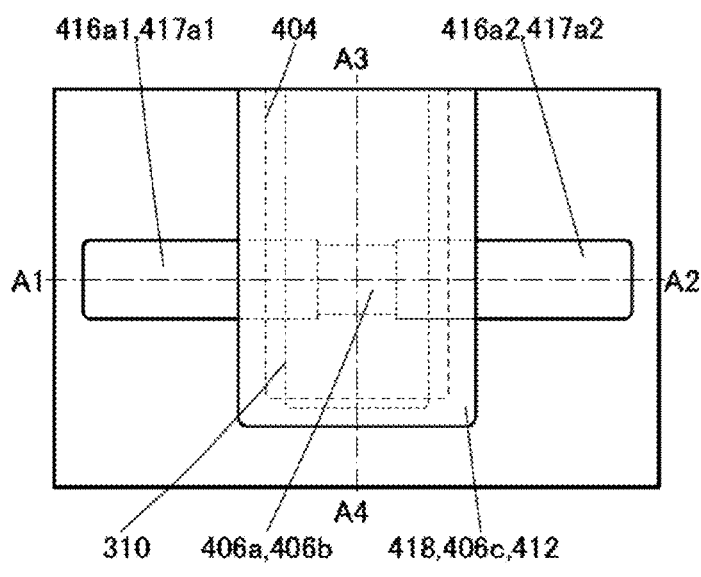
FIGS. 2A to 2C are a top view and cross-sectional views illustrating a structure of a transistor of one embodiment of the present invention.
Figure 2C:
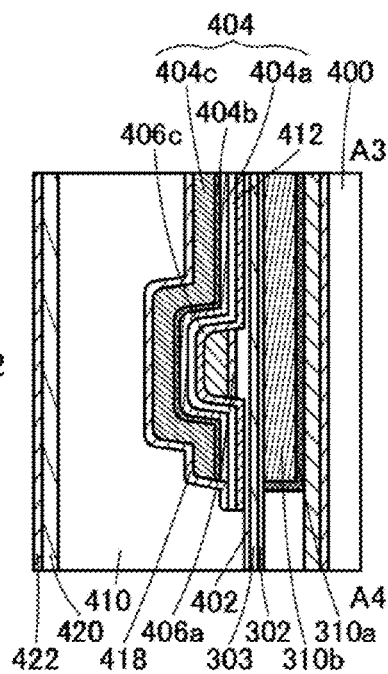
Figure 2B:
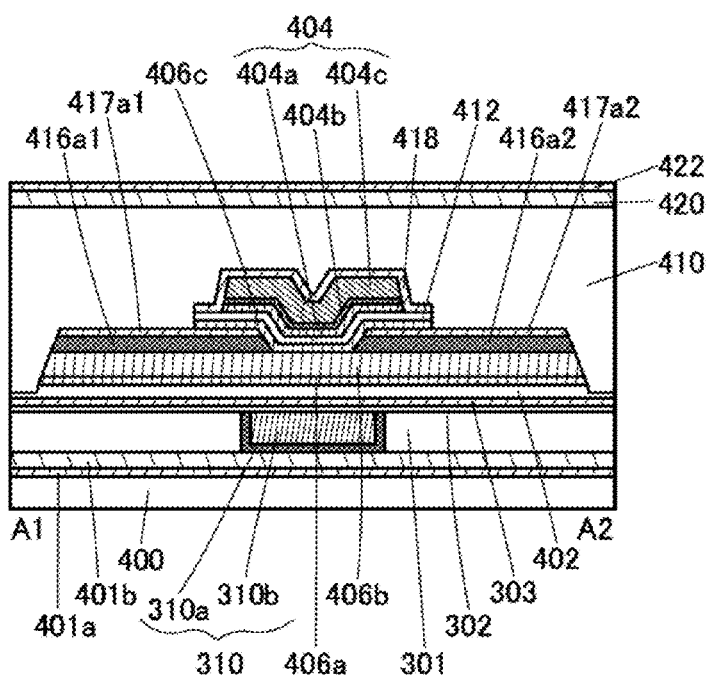

FIG. 2A is a top view of the transistor 200. FIG. 2B is a cross-sectional view taken along dashed-dotted line A1-A2 in FIG. 2A. FIG. 2C is a cross-sectional view taken along dashed-dotted line A3-A4 in FIG. 2A. In FIG. 2B, the cross-sectional view along A1-A2 is taken in the channel length direction of the transistor 200. In FIG. 2C, the cross-sectional view along A3-A4 is taken in the channel width direction of the transistor 200. Note that for simplification of the drawing, some components in the top view in FIG. 2A are not illustrated.

The transistor 200 is different from the transistor 100 in that the oxide 408a and the oxide 408b are not provided. The other components of the transistor 200 are similar to those of the transistor 100.

Here, for the oxide 420, a metal oxide that is formed by a sputtering method is preferably used, and for example, aluminum oxide is preferably used. Such an oxide 420 enables oxygen to be added to the insulator 412 from the oxide 420 through the insulator 410, and thus, the insulator 412 can be brought into an oxygen excess state. The oxygen can be supplied, by heat treatment or the like, to the channel formation region of the oxide 406b through the insulator 412. Since the insulator 412 and the channel formation region of the oxide 406b are adjacent to each other, a sufficient amount of oxygen can be supplied to the channel formation region of the oxide 406b. In addition, oxygen is added to the insulator 402 through the insulator 410, so that the insulator 402 can be brought into an oxygen excess state. The oxygen can be supplied to the channel formation region of the oxide 406b through the oxide 406a by heat treatment or the like. Accordingly, even when the transistors 200 are provided at a high density, a sufficient amount of oxygen can be supplied to the channel formation region of each transistor, and favorable electrical characteristics can be obtained regardless of the transistor density. The insulator 410 is formed using an insulating material that is more likely to transmit oxygen than the oxide 420. For example, silicon oxide or silicon oxynitride can be used.

In this manner, variation in the electrical characteristics of transistors can be suppressed regardless of transistor density. The density of the transistors 200 is higher than or equal to $0.01/\mu m^2$ and lower than or equal to $2500/\mu m^2$, preferably higher than or equal to $0.1/\mu m^2$ and lower than or equal to $2500/\mu m^2$, further preferably higher than or equal to $1/\mu m^2$ and lower than or equal to $2500/\mu m^2$, still further preferably higher than or equal to $10/\mu m^2$ and lower than or equal to $2500/\mu m^2$, even still further preferably higher than or equal to $100/\mu m^2$ and lower than or equal to $2500/\mu m^2$.

The density of the transistors 200 is higher than that of the transistors 100. The size of the transistor 100 is larger than that of the transistor 200.

As described above, in a circuit including transistors with different sizes, the transistor 100 is preferably used, and in a circuit with a high transistor density, i.e., a circuit including a large number of transistors per unit area, the transistor 200 is preferably used. The transistor 100 and the transistor 200 can be provided over the same layer.

<Structure Example 2 of Transistor>

Figure 3A:
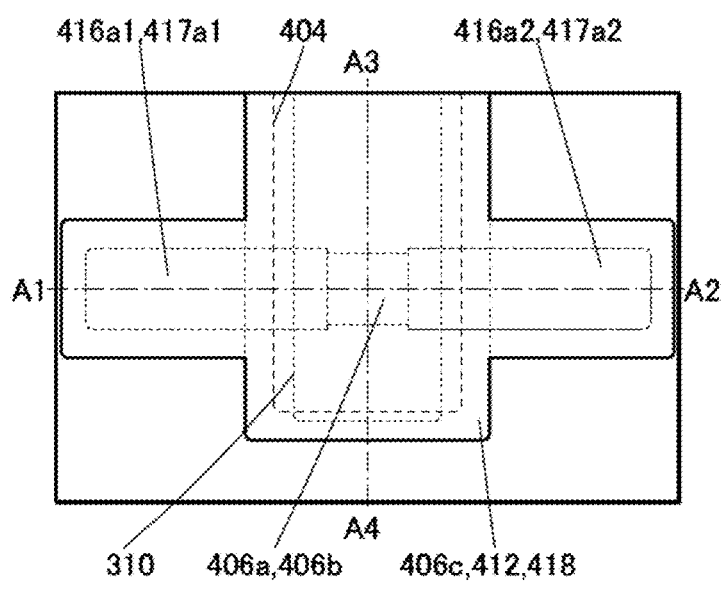
FIGS. 3A to 3C are a top view and cross-sectional views illustrating a structure of a transistor of one embodiment of the present invention.
Figure 3C:
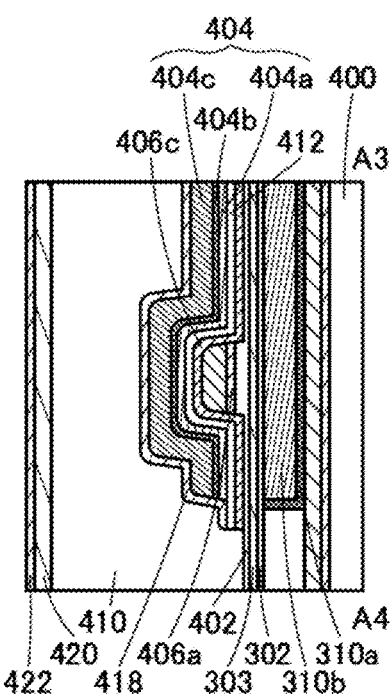
Figure 3B:
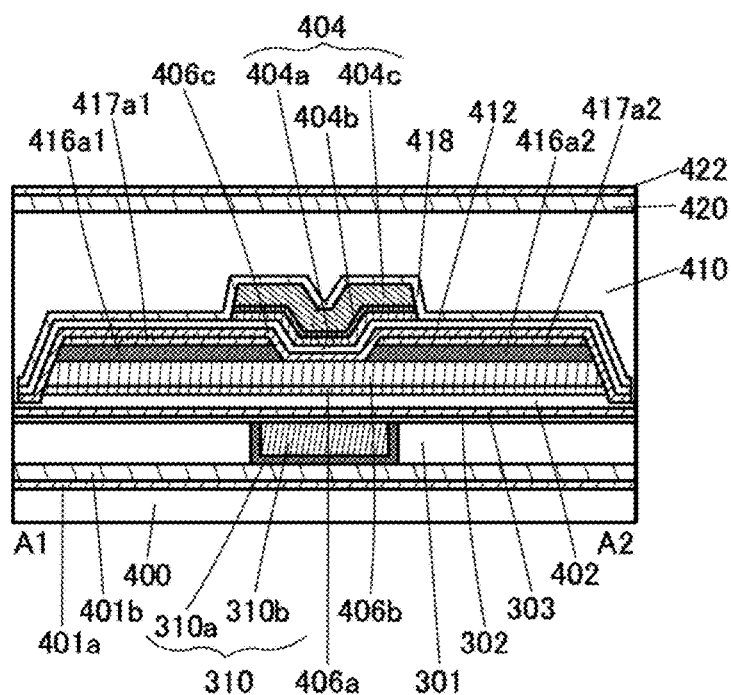

FIG. 3A is a top view of a transistor 100A. FIG. 3B is a cross-sectional view taken along dashed-dotted line A1-A2 in FIG. 3A. FIG. 3C is a cross-sectional view taken along dashed-dotted line A3-A4 in FIG. 3A. In FIG. 3B, the cross-sectional view along A1-A2 is taken in the channel length direction of the transistor 100A. In FIG. 3C, the cross-sectional view along A3-A4 is taken in the channel width direction of the transistor 100A. Note that for simplification of the drawing, some components in the top view in FIG. 3A are not illustrated.

In FIGS. 3B and 3C, the transistor 100A is provided over the oxide 401a over the substrate 400 and the oxide 401b over the oxide 401a. The transistor 100A includes the conductor 310a, the conductor 310b, and the insulator 301 over the oxide 401b; the insulator 302 over the conductor 310a, the conductor 310b, and the insulator 301; the insulator 303 over the insulator 302; the insulator 402 over the insulator 303; the oxide 406a over the insulator 402; the oxide 406b over the oxide 406a; the conductor 416a1 and the conductor 416a2 each including a region in contact with the top surface of the oxide 406b; the barrier film 417a1 over the conductor 416a1; the barrier film 417a2 over the conductor 416a2; the oxide 406c including a region in contact with the side surface of the conductor 416a1, the side surface of the conductor 416a2, the side surface of the barrier film 417a1, the side surface of the barrier film 417a2, and the top surface of the oxide 406b; the insulator 412 over the oxide 406c; and the conductor 404 including a region overlapping with the top surface of the oxide 406b with the oxide 406c and the insulator 412 therebetween. The insulator 301 has an opening, and the conductor 310a and the conductor 310b are provided in the opening.

Over the transistor 100A, the oxide 418, the insulator 410 over the oxide 418, the oxide 420 over the insulator 410, and the oxide 422 over the oxide 420 are provided.

In the cross-sectional view in the channel length direction in FIG. 3B, the end portions of the oxide 418, the end portions of the insulator 412, and the end portions of the oxide 406c are aligned and positioned over the insulator 402. In the cross-sectional view in the channel width direction in FIG. 3C, the end portion of the oxide 418, the end portion of the insulator 412, and the end portion of the oxide 406c are also aligned and positioned over the insulator 402. The oxide 406c covers the barrier film 417a1 and the barrier film 417a2 and includes a region in contact with the side surface of the oxide 406a, the side surface of the oxide 406b, and the top surface of the insulator 402.

Here, for the oxide 420, a metal oxide that is formed by a sputtering method is preferably used, and for example, aluminum oxide is preferably used. Such an oxide 420 enables oxygen to be added to the insulator 402 from the oxide 420 through the insulator 410, and thus, the insulator 402 can be brought into an oxygen excess state. The oxygen can be effectively supplied, by heat treatment or the like, to the oxide 406a and the channel formation region of the oxide 406b through the insulator 402.

In addition, when a metal oxide that has a function of inhibiting the passage of oxygen, such as aluminum oxide, is used for the oxide 418 like the oxide 408a, addition of oxygen from the insulator 410 to the insulator 412 is prevented. The effect of addition of oxygen in the insulator 412 to the oxide 406b including the channel formation region depends on the size of a transistor. That is, oxygen is added nonuniformly to a transistor with a small channel width and a transistor with a large channel width, which causes variation in the electrical characteristics of transistors with different sizes. Therefore, preventing oxygen from being added to the insulator 412 can reduce the dependence of the transistor characteristics on the transistor size. When the sizes of the oxides 418 in the transistors with different sizes are set substantially the same, in some cases, oxygen can be added to the transistors uniformly and the dependence of the transistor characteristics on the transistor size can be reduced. Thus, the transistor 100A can have favorable characteristics regardless of size.

The description of the transistor 100 can be referred to for the other functions and effects of the transistor 100A.

Figure 4A:
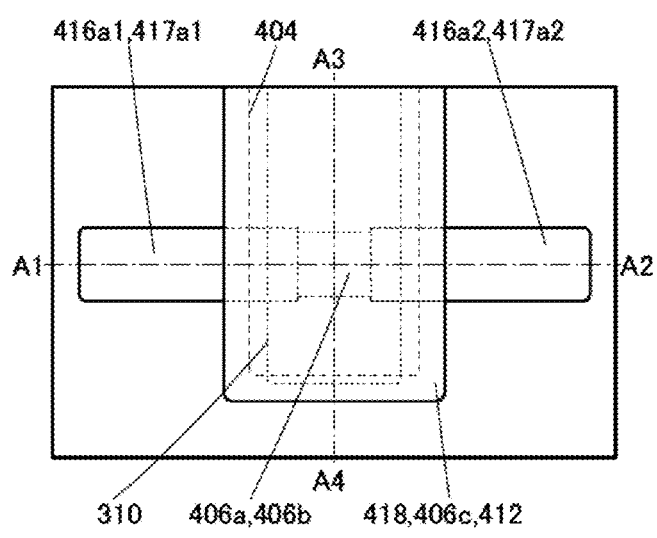
FIGS. 4A to 4C are a top view and cross-sectional views illustrating a structure of a transistor of one embodiment of the present invention.
Figure 4C:
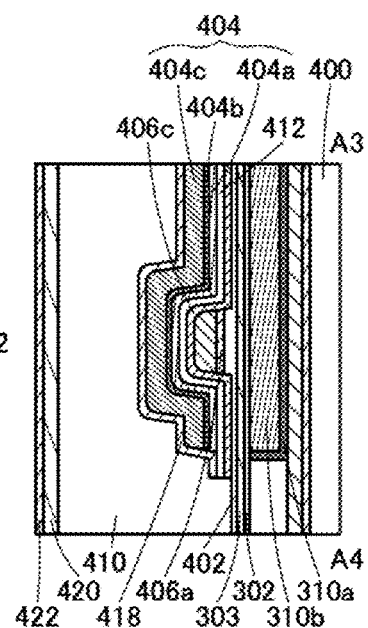
Figure 4B:
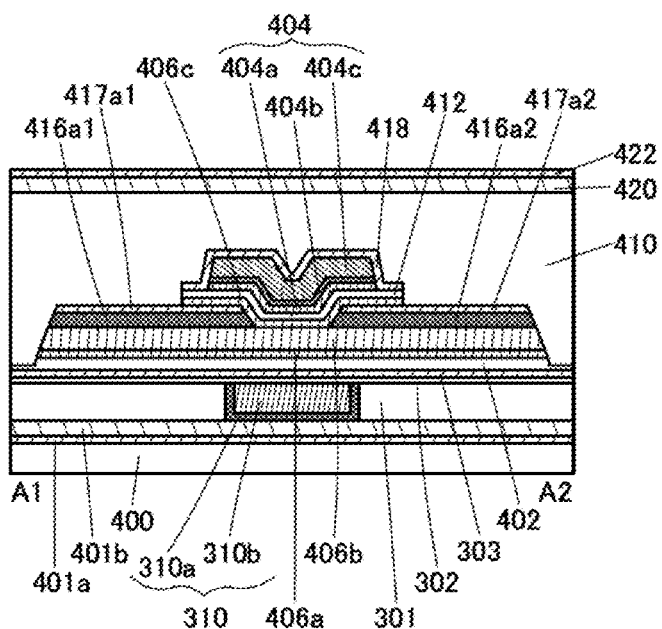
Figure 5A:
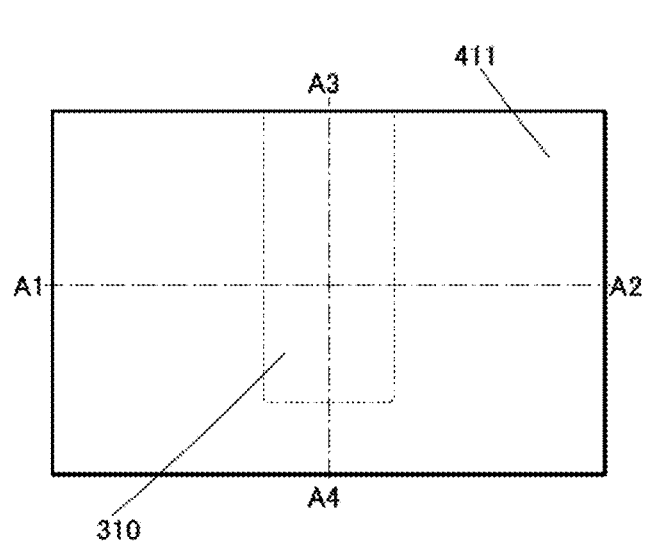
FIGS. 5A to 5C are a top view and cross-sectional views illustrating a method for manufacturing a transistor of one embodiment of the present invention.
Figure 5C:
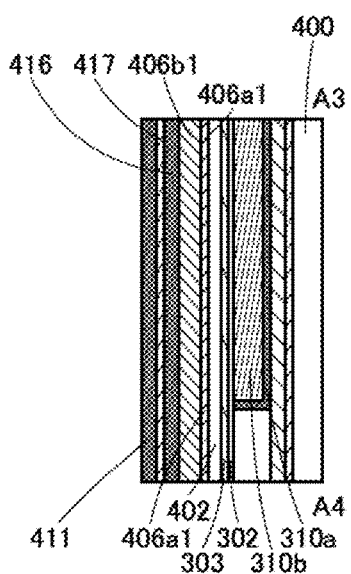
Figure 5B:
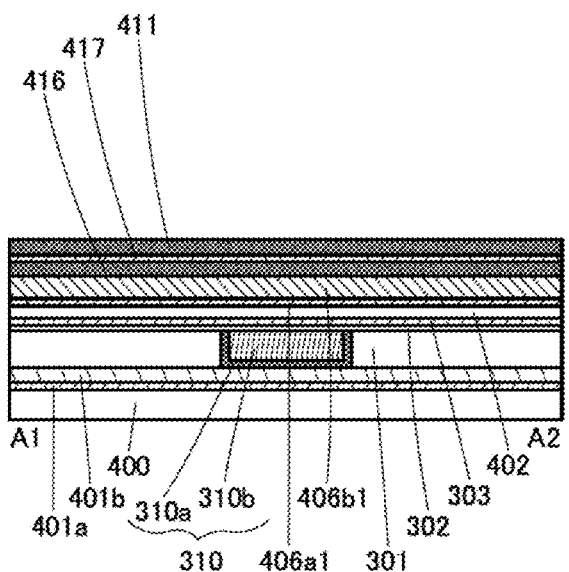
Figure 6A:
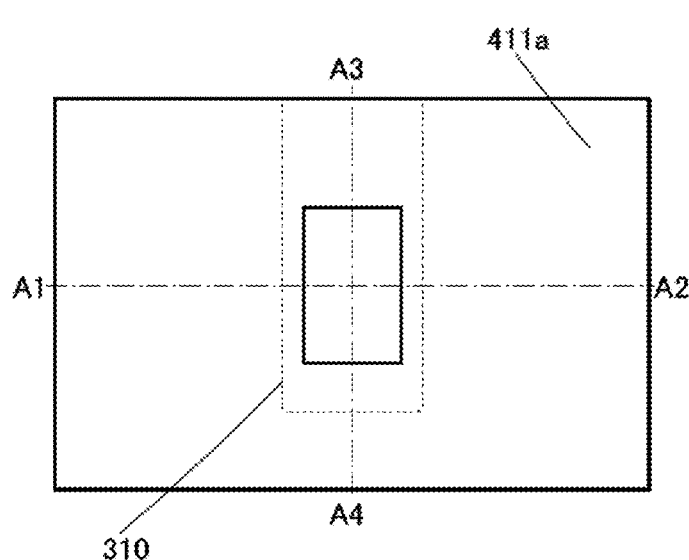
FIGS. 6A to 6C are a top view and cross-sectional views illustrating a method for manufacturing a transistor of one embodiment of the present invention.
Figure 6B:
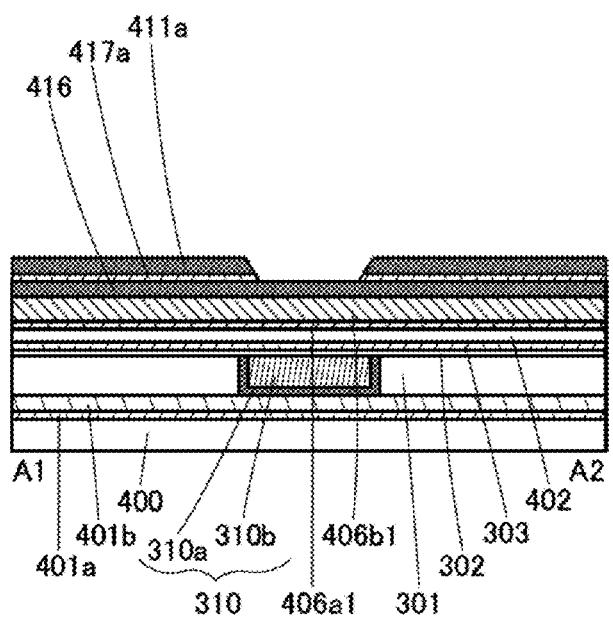
Figure 6C:
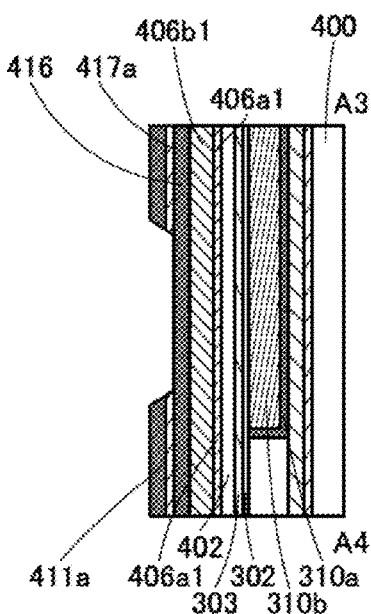

FIG. 4A is a top view of a transistor 200A. FIG. 4B is a cross-sectional view taken along dashed-dotted line A1-A2 in FIG. 4A. FIG. 4C is a cross-sectional view taken along dashed-dotted line A3-A4 in FIG. 4A. In FIG. 4B, the cross-sectional view along A1-A2 is taken in the channel length direction of the transistor 200A. In FIG. 4C, the cross-sectional view along A3-A4 is taken in the channel width direction of the transistor 200A. Note that for simplification of the drawing, some components in the top view in FIG. 4A are not illustrated.

In FIGS. 4B and 4C, like the transistor 200, the transistor 200A is provided over the oxide 401a over the substrate 400 and the oxide 401b over the oxide 401a. The transistor 200A includes the conductor 310a, the conductor 310b, and the insulator 301 over the oxide 401b; the insulator 302 over the conductor 310a, the conductor 310b, and the insulator 301; the insulator 303 over the insulator 302; the insulator 402 over the insulator 303; the oxide 406a over the insulator 402; the oxide 406b over the oxide 406a; the conductor 416a1 and the conductor 416a2 each including a region in contact with the top surface of the oxide 406b; the barrier film 417a1 over the conductor 416a1; the barrier film 417a2 over the conductor 416a2; the oxide 406c including a region in contact with the side surface of the conductor 416a1, the side surface of the conductor 416a2, the side surface of the barrier film 417a1, the side surface of the barrier film 417a2, and the top surface of the oxide 406b; the insulator 412 over the oxide 406c; and the conductor 404 including a region overlapping with the top surface of the oxide 406b with the oxide 406c and the insulator 412 therebetween. The insulator 301 has an opening, and the conductor 310a and the conductor 310b are provided in the opening.

Over the transistor 200A, the oxide 418, the insulator 410 over the oxide 418, the oxide 420 over the insulator 410, and the oxide 422 over the oxide 420 are provided.

In the cross-sectional view in the channel length direction in FIG. 4B, the end portions of the oxide 418, the end portions of the insulator 412, and the end portions of the oxide 406c are aligned and positioned over the barrier film 417a1 and the barrier film 417a2. In the cross-sectional view in the channel width direction in FIG. 4C, the end portion of the oxide 418, the end portion of the insulator 412, and the end portion of the oxide 406c are aligned and positioned over the insulator 402.

Here, for the oxide 420, an oxide that is formed by a sputtering method is preferably used, and for example, aluminum oxide is preferably used. Such an oxide 420 enables oxygen to be added to the insulator 412 from the oxide 420 through the insulator 410, and thus, the insulator 412 can be brought into an oxygen excess state. The oxygen can be supplied, by heat treatment or the like, to the channel formation region of the oxide 406b through the insulator 412. Since the insulator 412 and the channel formation region are adjacent to each other, a sufficient amount of oxygen can be supplied to the channel formation region. Accordingly, a sufficient amount of oxygen can be supplied to a channel formation region of a transistor regardless of the transistor density, whereby favorable electrical characteristics can be obtained regardless of the transistor density.

The description of the transistor 200 can be referred to for the other functions and effects of the transistor 200A.

As described above, in a circuit including transistors with different sizes, the transistor 100A is preferably used, and in a circuit with a high transistor density, i.e., a circuit including a large number of transistors per unit area, the transistor 200A is preferably used. The transistor 100A and the transistor 200A can be provided over the same layer.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a robust semiconductor device can be provided.

For the substrate 400 that is a flexible substrate, metal, an alloy, a resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

The transistor is surrounded by an insulator that has a function of inhibiting the passage of oxygen and impurities such as hydrogen, whereby the transistor can have stable electrical characteristics. For example, an insulator that has a function of inhibiting the passage of oxygen and impurities such as hydrogen may be used as each of the insulator 303 and the oxides 401a, 401b, 408a, 408b, 418, 420, and 422.

An insulator that has a function of inhibiting the passage of oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 303 and the oxides 401a, 401b, 408a, 408b, 418, 420, and 422 may each be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 303 and the oxides 401a, 401b, 408a, 408b, 418, 420, and 422 each preferably include aluminum oxide.

For example, when the oxide 408a or the oxide 422 is formed by a sputtering method with the use of plasma including oxygen, oxygen can be added to an insulator serving as a base layer of the oxide.

The insulators 301, 302, 402, and 412 can each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, and 412 preferably contain silicon oxide, silicon oxynitride, or silicon nitride.

In particular, the insulators 402 and 412 preferably include an insulator with a high relative permittivity. For example, the insulators 402 and 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, the insulators 402 and 412 each preferably have a stacked-layer structure of silicon oxide or silicon oxynitride and an insulator with a high relative permittivity. Because silicon oxide and silicon oxynitride have thermal stability, combination of silicon oxide or silicon oxynitride with an insulator with a high relative permittivity allows the stacked-layer structure to be thermally stable and have a high relative permittivity. For example, when aluminum oxide, gallium oxide, or hafnium oxide is positioned on the oxide 406c side in each of the insulators 402 and 412, entry of silicon included in silicon oxide or silicon oxynitride into the oxide 406b can be inhibited. When silicon oxide or silicon oxynitride is positioned on the oxide 406c side in each of the insulators 402 and 412, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with a low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon or aramid), polyimide, polycarbonate, and acrylic.

An insulator that has a function of inhibiting the passage of oxygen and impurities such as hydrogen may be used for each of the barrier films 417a1 and 417a2. The barrier films 417a1 and 417a2 can prevent excess oxygen included in the insulator 410 from diffusing to the conductors 416a1 and 416a2.

The barrier films 417a1 and 417a2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example.

<Conductor>

The conductors 404a, 404b, 404c, 310a, 310b, 416a1, and 416a2 can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon including an impurity element such as phosphorus, or silicide such as nickel silicide may be used.

Alternatively, a conductive material including oxygen and a metal element included in a metal oxide that can be used for the oxides 406a, 406b, and 406c and is to be described later may be used. A conductive material including any of the above metal elements and nitrogen may be used. For example, a conductive material including nitrogen, such as titanium nitride or tantalum nitride, may be used. Indium tin oxide (ITO), indium oxide including tungsten oxide, indium zinc oxide including tungsten oxide, indium oxide including titanium oxide, indium tin oxide including titanium oxide, indium zinc oxide, or indium tin oxide to which silicon is added may be used. Indium gallium zinc oxide including nitrogen may be used. With any of such materials, hydrogen included in the oxides 406a, 406b, and 406c can be captured in some cases. Alternatively, hydrogen entering from an external insulator or the like can be captured in some cases.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When an oxide is used for the channel formation region of the transistor, a stacked-layer structure formed using a combination of a material including any of the above-described metal elements and a conductive material including oxygen is preferably used for the gate electrode. In that case, the conductive material including oxygen is preferably formed on the channel formation region side. When the conductive material including oxygen is formed on the channel formation region side, oxygen released from the conductive material is likely to be supplied to the channel formation region.

<Metal Oxide that can be Used for Oxides 406a, 406b, and 406c>

A metal oxide is preferably used for each of the oxides 406a, 406b, and 406c. However, silicon (including strained silicon), germanium, silicon germanium, silicon carbide, gallium arsenide, aluminum gallium arsenide, indium phosphide, gallium nitride, an organic semiconductor, or the like may be used instead of each of the oxides 406a, 406b, and 406c in some cases.

A metal oxide that can be used for the oxides 406a, 406b, and 406c is described.

The metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide is InMZnO containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

<Structure>

An oxide is classified into a single crystal oxide and a non-single-crystal oxide. Examples of a non-single-crystal oxide include a c-axis-aligned crystalline oxide semiconductor (CAAC-OS), a polycrystalline oxide, a nanocrystalline oxide semiconductor (nc-OS), an amorphous-like oxide semiconductor (a-like OS), and an amorphous oxide.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide, depending on an analysis method.

The a-like OS has a structure between those of the nc-OS and the amorphous oxide. The a-like OS has a void or a low-density region. That is, the a-like OS has low crystallinity as compared with the nc-OS and the CAAC-OS.

An oxide can have various structures which show various different properties. Two or more of the amorphous oxide, the polycrystalline oxide, the a-like OS, the nc-OS, and the CAAC-OS may be included in an oxide of one embodiment of the present invention.

<Atomic Ratio>

Next, preferred ranges of the atomic ratio of indium, the element M, and zinc contained in an oxide according to the present invention are described with reference to FIGS. 20A to 20C. Note that the proportion of oxygen atoms is not shown in FIGS. 20A to 20C. The terms of the atomic ratio of indium, the element M, and zinc contained in the oxide are denoted by [In], [M], and [Zn], respectively.

Figure 20A:
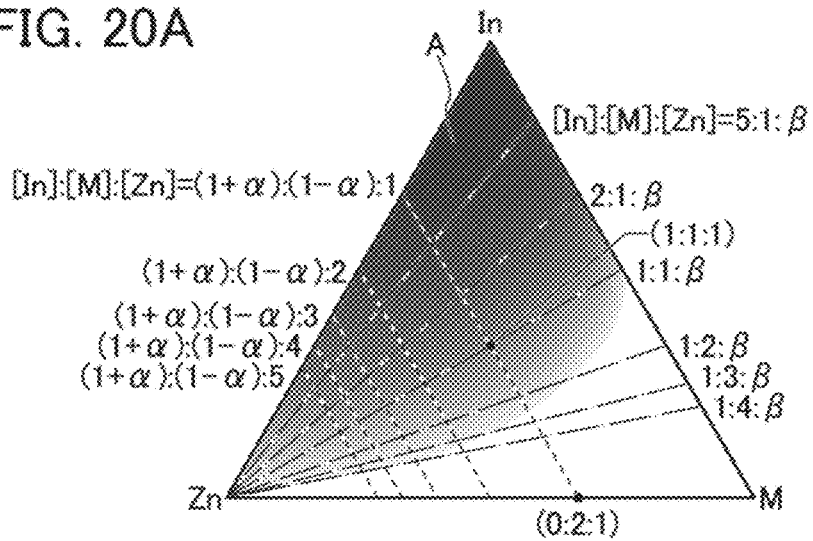
FIGS. 20A to 20C each illustrate an atomic ratio of an oxide of the present invention.
Figure 20B:
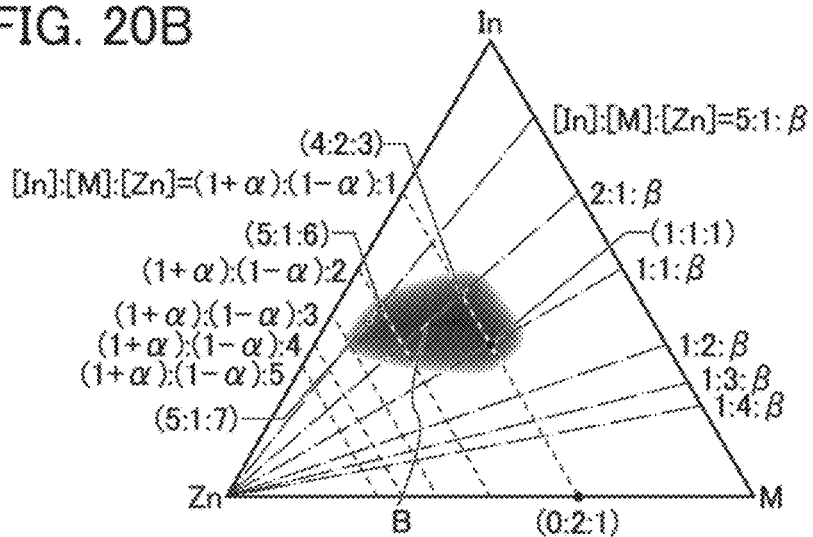
Figure 20C:
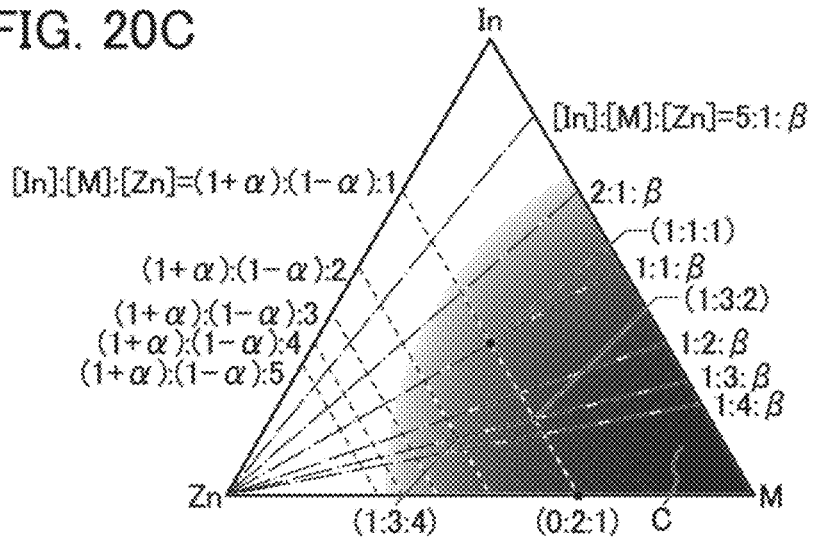

In FIGS. 20A to 20C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

An oxide with the atomic ratio [In]:[M]:[Zn] of 0:2:1 or around 0:2:1 in FIGS. 20A to 20C tends to have a spinel crystal structure.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

A region A in FIG. 20A shows an example of the preferred ranges of the atomic ratio of indium, the element M, and zinc contained in an oxide.

An oxide having a high content of indium can have high carrier mobility (electron mobility). Thus, an oxide having a high content of indium has higher carrier mobility than an oxide having a low content of indium.

In contrast, carrier mobility decreases as the indium content and the zinc content in an oxide become lower. Thus, with an atomic ratio [In]:[M]:[Zn] of 0:1:0 and the vicinity thereof (e.g., a region C in FIG. 20C), insulation performance becomes better.

Accordingly, an oxide of one embodiment of the present invention preferably has an atomic ratio represented by the region A in FIG. 20A. With the atomic ratio, a layered structure with high carrier mobility and a few grain boundaries is easily obtained.

In the region A, in particular a region B in FIG. 20B, an excellent oxide which easily becomes a CAAC-OS and has high carrier mobility can be obtained.

The CAAC-OS is an oxide with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has high reliability.

Note that the region B includes an atomic ratio [In]:[M]:[Zn] of 4:2:3 to 4:2:4.1 and the vicinity thereof. The vicinity includes an atomic ratio [In]:[M]:[Zn] of 5:3:4. Note that the region B includes an atomic ratio [In]:[M]:[Zn] of 5:1:6 and the vicinity thereof and an atomic ratio [In]:[M]:[Zn] of 5:1:7 and the vicinity thereof.

Note that the property of an oxide is not uniquely determined by an atomic ratio. Even with the same atomic ratio, the property of an oxide might be different depending on a formation condition. For example, in the case where the oxide is deposited with a sputtering apparatus, a film having an atomic ratio deviated from the atomic ratio of a target is formed. In addition, [Zn] in the film might be smaller than [Zn] in the target depending on the substrate temperature in deposition. Thus, the illustrated regions each represent an atomic ratio with which an oxide tends to have specific characteristics, and boundaries of the regions A to C are not clear.

[Transistor Including Oxide]

Next, the case where the oxide is used for a transistor is described.

When the oxide is used for a transistor, carrier scattering or the like at a grain boundary can be reduced; thus, the transistor can have high field-effect mobility. Moreover, the transistor can have high reliability.

An oxide with a low carrier density is preferably used for the transistor. In order to reduce the carrier density of the oxide film, the impurity concentration in the oxide film is reduced so that the density of defect states can be reduced. In this specification and the like, a state with a low impurity concentration and a low density of defect states is referred to as a highly purified intrinsic or substantially highly purified intrinsic state. For example, an oxide whose carrier density is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$ is used.

A highly purified intrinsic or substantially highly purified intrinsic oxide film has a low density of defect states and accordingly has a low density of trap states in some cases.

Charge trapped by the trap states in the oxide takes a long time to be released and may behave like fixed charge. Thus, a transistor whose channel region is formed in an oxide with a high density of trap states has unstable electrical characteristics in some cases.

In view of the above, to obtain stable electrical characteristics of a transistor, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

<Impurity>

Here, the influence of impurities in the oxide is described.

When silicon or carbon, which is a Group 14 element, is contained in the oxide, defect states are formed in the oxide. Thus, the concentration of silicon or carbon in the oxide and around an interface with the oxide (the concentration obtained by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains alkali metal or alkaline earth metal, defect states are formed and carriers are generated in some cases. Thus, a transistor using an oxide that contains alkali metal or alkaline earth metal is likely to have normally-on characteristics. Accordingly, it is preferable to reduce the concentration of alkali metal or alkaline earth metal in the oxide. Specifically, the concentration of alkali metal or alkaline earth metal in the oxide measured by SIMS is set lower than or equal to $1 \times 10^{18}$ atoms/cm$^3$, preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used as a semiconductor is likely to have normally-on characteristics. For this reason, nitrogen in the oxide is preferably reduced as much as possible. For example, the nitrogen concentration in the oxide measured by SIMS is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide that contains hydrogen is likely to have normally-on characteristics. Accordingly, it is preferred that hydrogen in the oxide be reduced as much as possible. Specifically, the hydrogen concentration in the oxide measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide with sufficiently reduced impurity concentration is used for a channel region in a transistor, the transistor can have stable electrical characteristics.

<Band Diagram>

Figure 21A:
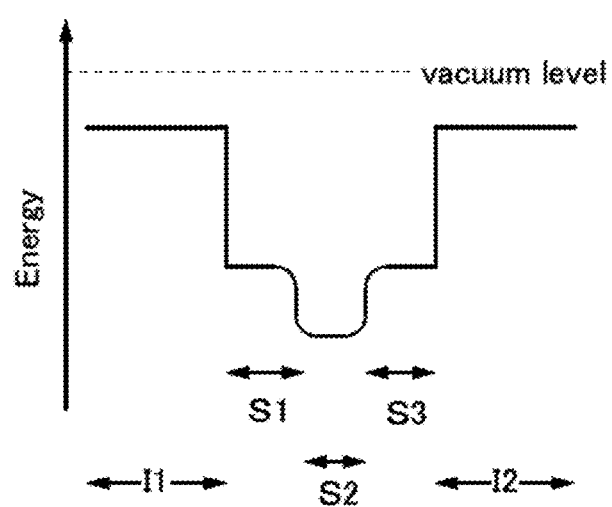
FIGS. 21A to 21C are each a band diagram of a stacked-layer structure of an oxide.
Figure 21B:
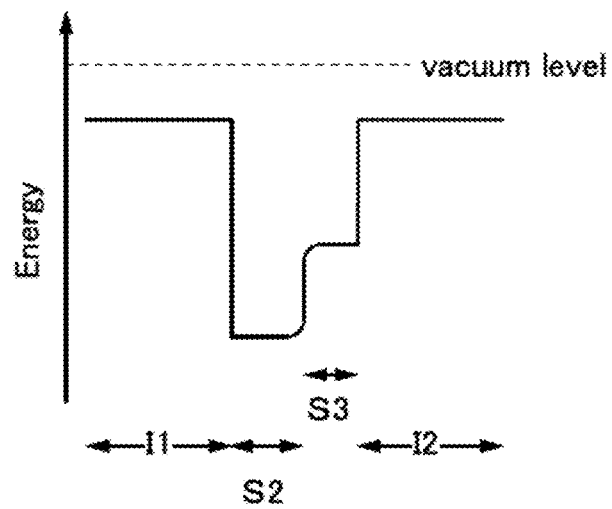
Figure 21C:
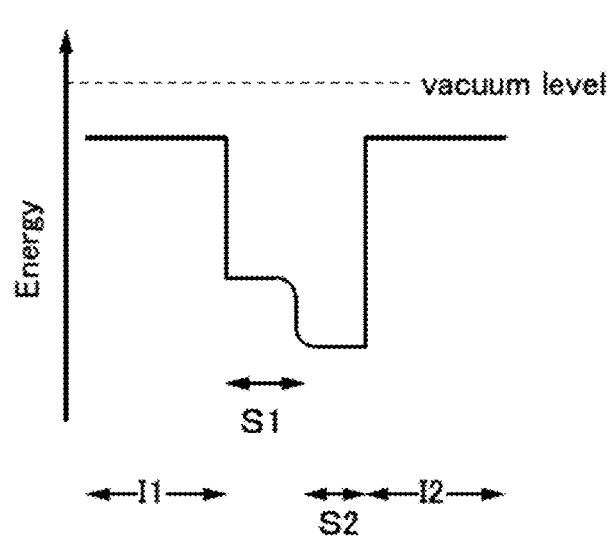

Next, the case where the oxide has a two-layer structure or a three-layer structure will be described. With reference to FIGS. 21A to 21C, the description is made on a band diagram of a layered structure of an oxide S1, an oxide S2, and an oxide S3 and insulators that are in contact with the layered structure; a band diagram of a layered structure of the oxide S2 and the oxide S3 and insulators that are in contact with the layered structure; and a band diagram of a layered structure of the oxide S1 and the oxide S2 and insulators that are in contact with the layered structure.

FIG. 21A is an example of a band diagram of a layered structure including an insulator I1, the oxide S1, the oxide S2, the oxide S3, and an insulator I2 in the thickness direction. FIG. 21B is an example of a band diagram of a layered structure including the insulator I1, the oxide S2, the oxide S3, and the insulator I2 in the thickness direction. FIG. 21C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 21A to 21C, the energy level of the conduction band minimum of each of the oxides S1 to S3 is gradually varied. In other words, the energy level of the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a large on-state current can be obtained.

When an electron is trapped by a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 20C can be used as the oxides S1 and S3. Note that the region C in FIG. 20C represents the atomic ratio [In]:[M]:[Zn] of 0:1:0, 1:3:2, and 1:3:4 and the vicinities thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

This embodiment can be implemented in an appropriate combination with any of the structures described in the other embodiments, Examples, and the like.

Embodiment 2

<Method 1 for Manufacturing Transistor>

Figure 13A:
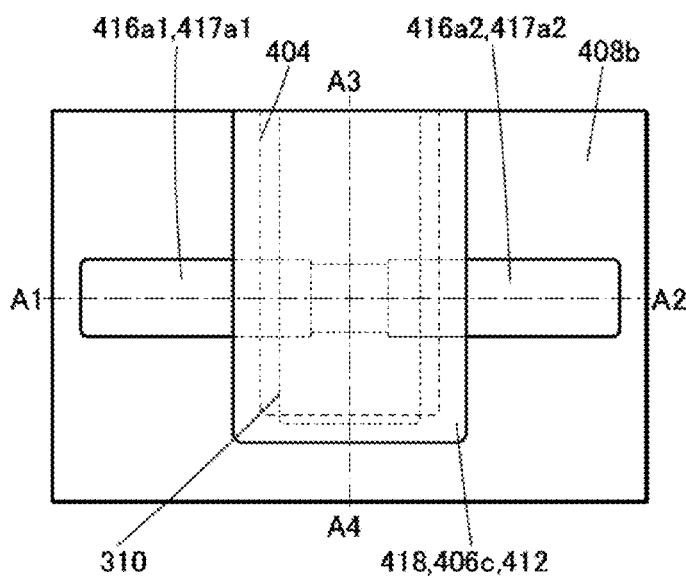
FIGS. 13A to 13C are a top view and cross-sectional views illustrating a method for manufacturing a transistor of one embodiment of the present invention.
Figure 13C:
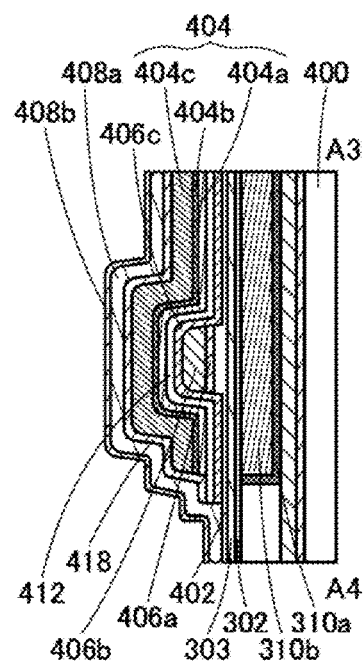
Figure 13B:
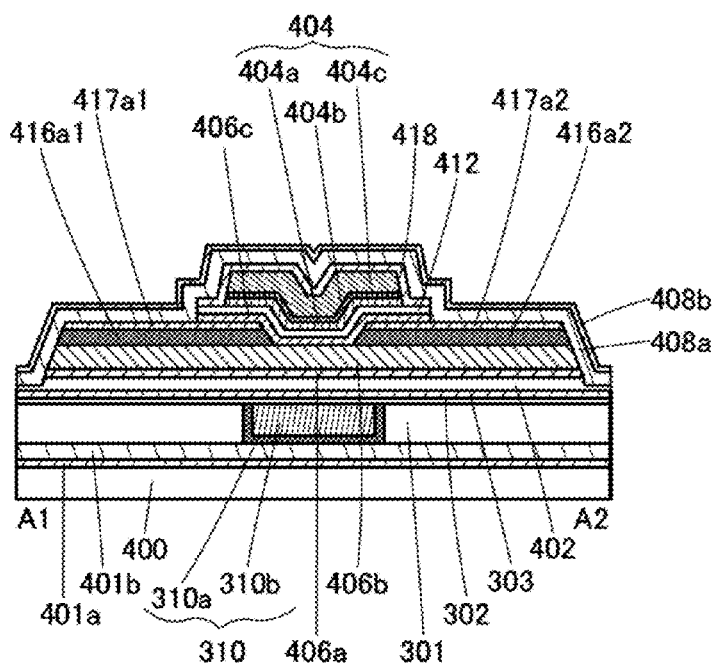
Figure 14A:
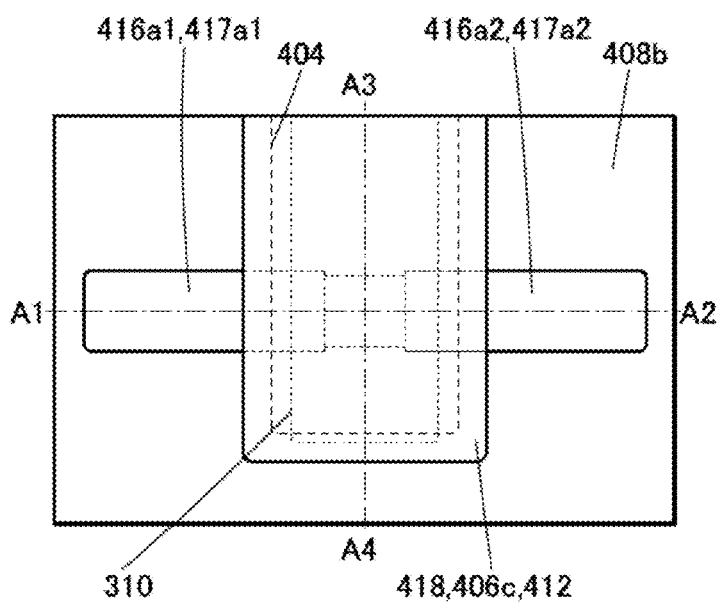
FIGS. 14A to 14C are a top view and cross-sectional views illustrating a method for manufacturing a transistor of one embodiment of the present invention.
Figure 14C:
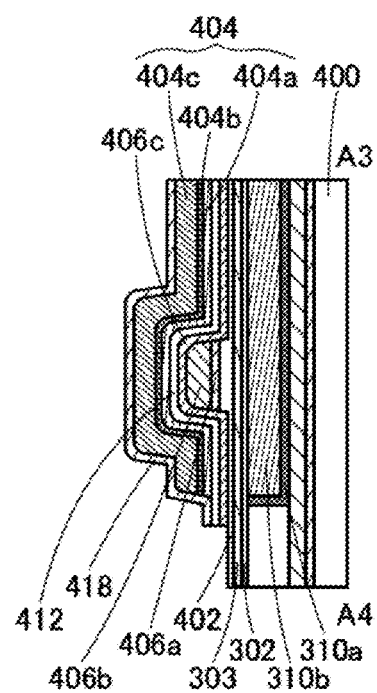
Figure 14B:
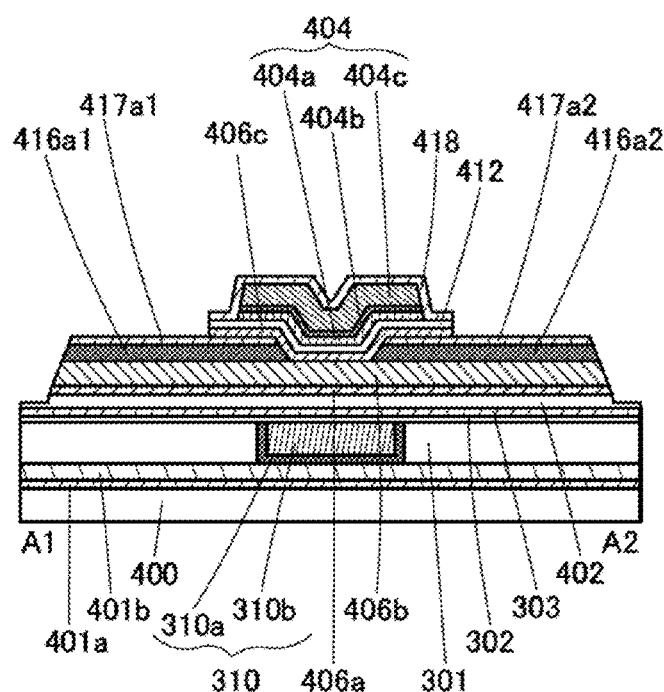

A method for manufacturing the transistors 100 and 200 of the present invention is described below with reference to FIGS. 1A to 1C, FIGS. 2A to 2C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C. Note that FIG. 5A to FIG. 12C illustrate manufacturing steps common to the transistors 100 and 200, FIGS. 13A to 13C illustrate a step of manufacturing the transistor 100, and FIGS. 14A to 14C illustrate a step of manufacturing the transistor 200. FIG. 1A, FIG. 2A, FIG. 5A, FIG. 6A, FIG. 7A, FIG. 8A, FIG. 9A, FIG. 10A, FIG. 11A, FIG. 12A, FIG. 13A, and FIG. 14A are top views. FIG. 1B, FIG. 2B, FIG. 5B, FIG. 6B, FIG. 7B, FIG. 8B, FIG. 9B, FIG. 10B, FIG. 11B, FIG. 12B, FIG. 13B, and FIG. 14B are cross-sectional views taken along the dashed-dotted lines A1-A2 in FIG. 1A, FIG. 2A, FIG. 5A, FIG. 6A, FIG. 7A, FIG. 8A, FIG. 9A, FIG. 10A, FIG. 11A, FIG. 12A, FIG. 13A, and FIG. 14A. FIG. 1C, FIG. 2C, FIG. 5C, FIG. 6C, FIG. 7C, FIG. 8C, FIG. 9C, FIG. 10C, FIG. 11C, FIG. 12C, FIG. 13C, and FIG. 14C are cross-sectional views taken along the dashed-dotted lines A3-A4 in FIG. 1A, FIG. 2A, FIG. 5A, FIG. 6A, FIG. 7A, FIG. 8A, FIG. 9A, FIG. 10A, FIG. 11A, FIG. 12A, FIG. 13A, and FIG. 14A. In FIG. 1B, FIG. 2B, FIG. 5B, FIG. 6B, FIG. 7B, FIG. 8B, FIG. 9B, FIG. 10B, FIG. 11B, FIG. 12B, FIG. 13B, and FIG. 14B, the cross-sectional views along A1-A2 are taken in the channel length direction of the transistor, and in FIG. 1C, FIG. 2C, FIG. 5C, FIG. 6C, FIG. 7C, FIG. 8C, FIG. 9C, FIG. 10C, FIG. 11C, FIG. 12C, FIG. 13C, and FIG. 14C, the cross-sectional views along A3-A4 are taken in the channel width direction of the transistor.

First, the substrate 400 is prepared.

Next, the oxide 401a is formed. The oxide 401a can be formed by a sputtering method, a chemical vapor deposition (CVD) method, a molecular beam epitaxy (MBE) method, a pulsed laser deposition (PLD) method, an atomic layer deposition (ALD) method, or the like.

The CVD method can include a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using a PECVD method, a high-quality film can be formed at a relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a TCVD method not using plasma is employed, such plasma damage is not caused and the yield of semiconductor devices can be increased. A TCVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with a flow rate ratio of a source gas. For example, by a CVD method or an ALD method, a film with a certain composition can be formed depending on a flow rate ratio of a source gas. Moreover, by changing the flow rate ratio of a source gas during deposition by a CVD method or an ALD method, a film whose composition is continuously changed can be formed. In the case where a film is deposited while the flow rate ratio of a source gas is changed, the time for deposition can be shorter than in the case where a film is deposited using a plurality of deposition chambers because time for transfer and pressure adjustment can be saved. Thus, semiconductor devices can be manufactured with improved productivity in some cases.

Next, the oxide 401b is formed over the oxide 401a. The oxide 401b can be formed by a sputtering method, a CVD method, an MBE method, a PLD method, an ALD method, or the like. Then, the insulator 301 is formed over the oxide 401b. The insulator 301 can be formed by a sputtering method, a CVD method, an MBE method, a PLD method, an ALD method, or the like.

Then, a groove is formed in the insulator 301 so as to reach the oxide 401b. Examples of the groove include a hole and an opening. In forming the groove, wet etching may be employed; however, dry etching is preferably employed in terms of microfabrication. The oxide 401b is preferably an insulator that serves as an etching stopper film used in forming the groove by etching the insulator 301. For example, in the case where a silicon oxide film is used as the insulator 301 in which the groove is to be formed, the oxide 401b is preferably formed using a silicon nitride film, an aluminum oxide film, or a hafnium oxide film.

In this embodiment, aluminum oxide is deposited by a sputtering method for the oxide 401a, and aluminum oxide is deposited by an ALD method for the oxide 401b. Silicon oxide is deposited by a CVD method for the insulator 301.

After the formation of the groove, a conductor to be the conductor 310a is formed. The conductor to be the conductor 310a desirably contains a conductor that has a function of inhibiting the passage of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 310a can be formed by a sputtering method, a CVD method, an MBE method, a PLD method, an ALD method, or the like.

In this embodiment, tantalum nitride is deposited by a sputtering method for the conductor to be the conductor 310a.

Then, a conductor to be the conductor 310b is formed over the conductor to be the conductor 310a. The conductor to be the conductor 310b can be formed by a sputtering method, a CVD method, an MBE method, a PLD method, an ALD method, or the like.

In this embodiment, for the conductor to be the conductor 310b, titanium nitride is deposited by a CVD method and tungsten is deposited by a CVD method over the titanium nitride.

Next, chemical mechanical polishing (CMP) is performed to remove the conductor to be the conductor 310a and the conductor to be the conductor 310b that are located over the insulator 301. Consequently, the conductor to be the conductor 310a and the conductor to be the conductor 310b remain only in the groove, whereby the conductor 310 that includes the conductor 310a and the conductor 310b with flat top surfaces can be formed.

Next, the insulator 302 is formed over the insulator 301 and the conductor 310. The insulator 302 can be formed by a sputtering method, a CVD method, an MBE method, a PLD method, an ALD method, or the like.

Next, the insulator 303 is formed over the insulator 302. The insulator 303 can be formed by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in nitrogen, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in nitrogen or an inert gas atmosphere, and then another heat treatment is performed in an atmosphere containing an oxidizing gas at 10 ppm or more, 1% or more, or 10% or more in order to compensate released oxygen. By the first heat treatment, impurities such as hydrogen and water included in the insulator 402 can be removed, for example. Alternatively, in the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas with the apparatus, plasma treatment using oxygen in order to compensate released oxygen may be performed. Note that the first heat treatment is not necessarily performed in some cases.

This heat treatment can also be performed after the deposition of the insulator 302, after the deposition of the insulator 303, and after the deposition of the insulator 402. Although the heat treatment can be performed under the conditions for the first heat treatment, heat treatment after the deposition of the insulator 302 is preferably performed in an atmosphere containing nitrogen.

In this embodiment, the first heat treatment is performed in an atmosphere containing nitrogen at 400° C. for one hour after the deposition of the insulator 402.

Next, an oxide 406a1 is formed over the insulator 402. The oxide 406a1 can be formed by a sputtering method, a CVD method, an MBE method, a PLD method, an ALD method, or the like.

Next, treatment for adding oxygen to the oxide 406a1 may be performed. An ion implantation method, a plasma treatment method, or the like can be used for the treatment for adding oxygen. Note that oxygen added to the oxide 406a1 serves as excess oxygen. Next, an oxide 406b1 is formed over the oxide 406a1. The oxide 406b1 can be formed by a sputtering method, a CVD method, an MBE method, a PLD method, an ALD method, or the like.

After that, second heat treatment may be performed. For the second heat treatment, the conditions for the first heat treatment can be used. By the second heat treatment, impurities such as hydrogen and water included in the oxide 406b1 can be removed, for example. The second heat treatment may be performed in such a manner that treatment is performed in a nitrogen atmosphere at 400° C. for one hour and then another treatment is successively performed in an oxygen atmosphere at 400° C. for one hour.

Next, a conductor 416 is formed over the oxide 406b1. The conductor 416 can be formed by a sputtering method, a CVD method, an MBE method, a PLD method, an ALD method, or the like. For the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is deposited, and a material including one or more of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon including an impurity element such as phosphorus, or a silicide such as nickel silicide may be deposited over the oxide.

The oxide may have a function of absorbing hydrogen in the oxides 406a1 and 406b1 and capturing hydrogen diffused from the outside; thus, the electrical characteristics and reliability of the transistors 100 and 200 are improved in some cases. Titanium instead of the oxide may have a similar function. In this embodiment, tantalum nitride is deposited for the conductor 416.

Then, a barrier film 417 is formed over the conductor 416. The barrier film 417 can be formed by a sputtering method, a CVD method, an MBE method, a PLD method, an ALD method, or the like. In this embodiment, aluminum oxide is deposited for the barrier film 417.

Subsequently, a conductor 411 is formed over the barrier film 417. The conductor 411 can be formed by a sputtering method, a CVD method, an MBE method, a PLD method, an ALD method, or the like. In this embodiment, tantalum nitride is deposited for the conductor 411 (see FIGS. 5A to 5C).

Next, the conductor 411 and the barrier film 417 are processed by a lithography method to form a conductor 411a and a barrier film 417a. Through this processing, a tapered cross section is preferably formed. The taper angle between the cross section and a plane parallel to the bottom surface of the substrate is greater than or equal to 30° and less than 75°, preferably greater than or equal to 30° and less than 70°. With such a taper angle, coverage with films formed later in the manufacturing process can be improved. The processing is preferably performed by a dry etching method. The dry etching method is suitable for microfabrication and the above described formation of a tapered shape (see FIGS. 6A to 6C).

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, a resist 421 is formed by a lithography method.

Figure 7A:
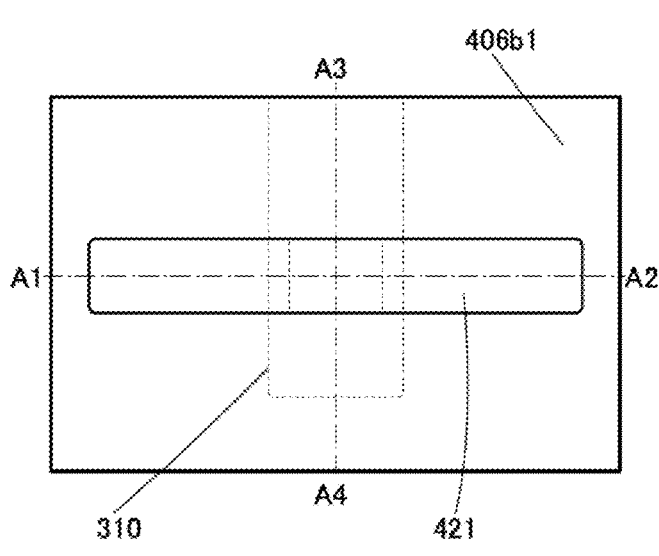
FIGS. 7A to 7C are a top view and cross-sectional views illustrating a method for manufacturing a transistor of one embodiment of the present invention.
Figure 7C:
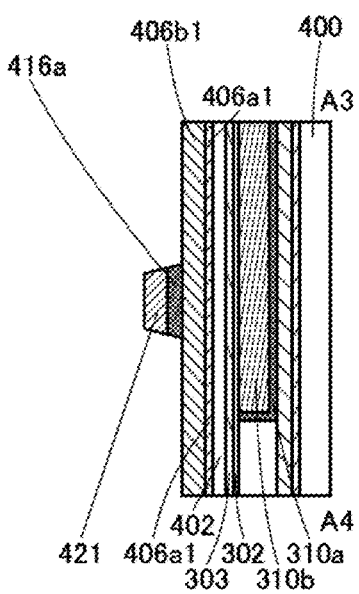
Figure 7B:
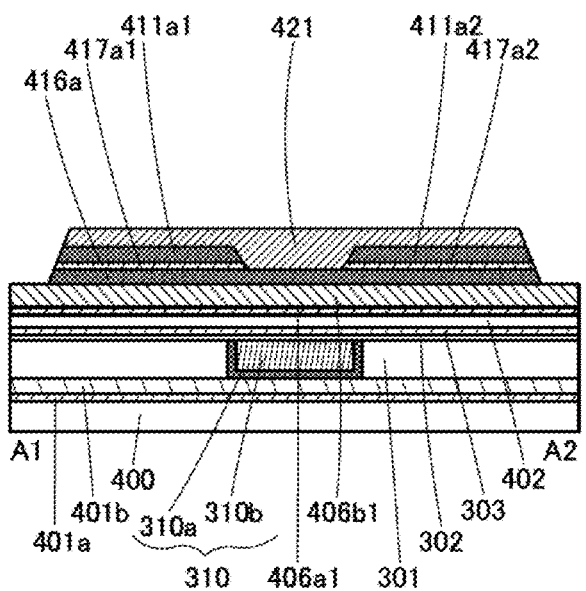
Figure 8A:
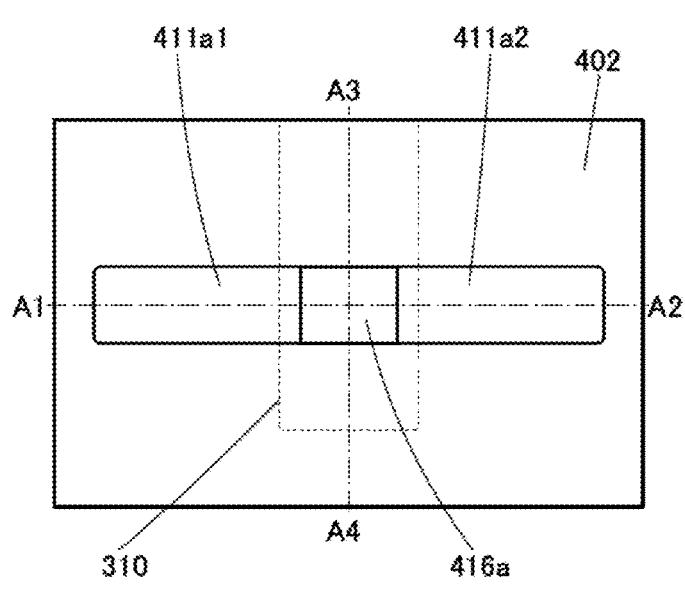
FIGS. 8A to 8C are a top view and cross-sectional views illustrating a method for manufacturing a transistor of one embodiment of the present invention.
Figure 8C:
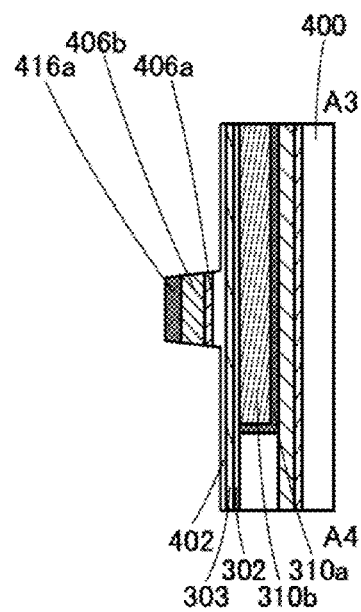
Figure 8B:
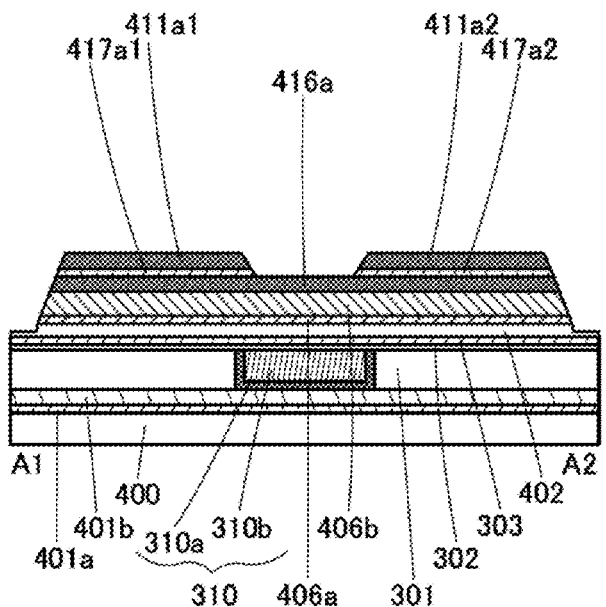

Next, the conductor 411a, the barrier film 417a, and the conductor 416 are etched with the use of the resist 421 as an etching mask to form a conductor 411a1, a conductor 411a2, the barrier film 417a1, the barrier film 417a2, and a conductor 416a (see FIGS. 7A to 7C).

Next, the resist 421 is removed, and then the oxide 406a1 and the oxide 406b1 are etched with the use of the conductor 411a1, the conductor 411a2, and an exposed portion of the surface of the conductor 416a as etching masks to form the oxide 406a and the oxide 406b. Since tantalum nitride is used for the conductor 411a1, the conductor 411a2, and the conductor 416a in this embodiment, the oxide 406a1 and the oxide 406b1 are preferably processed under an etching condition in which the etching rates of the oxides 406a1 and 406b1 are higher than the etching rate of tantalum nitride. When the etching rate of tantalum nitride is regarded as 1, the etching rates of the oxides 406a1 and 406b1 are higher than or equal to 3 and lower than or equal to 50, preferably higher than or equal to 5 and lower than or equal to 30 (see FIGS. 8A to 8C).

Figure 9A:
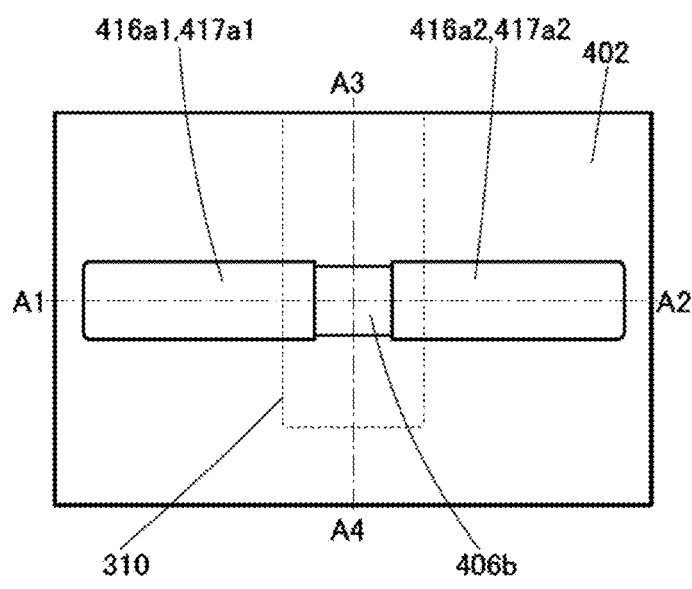
FIGS. 9A to 9C are a top view and cross-sectional views illustrating a method for manufacturing a transistor of one embodiment of the present invention.
Figure 9C:
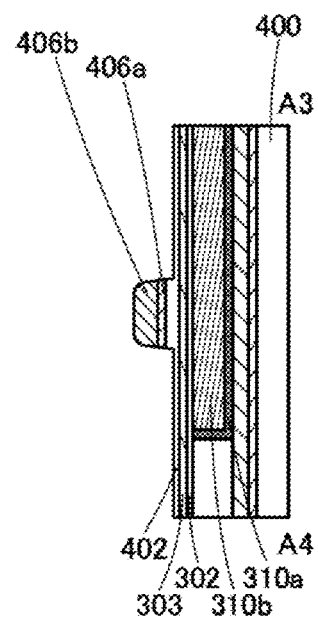
Figure 9B:
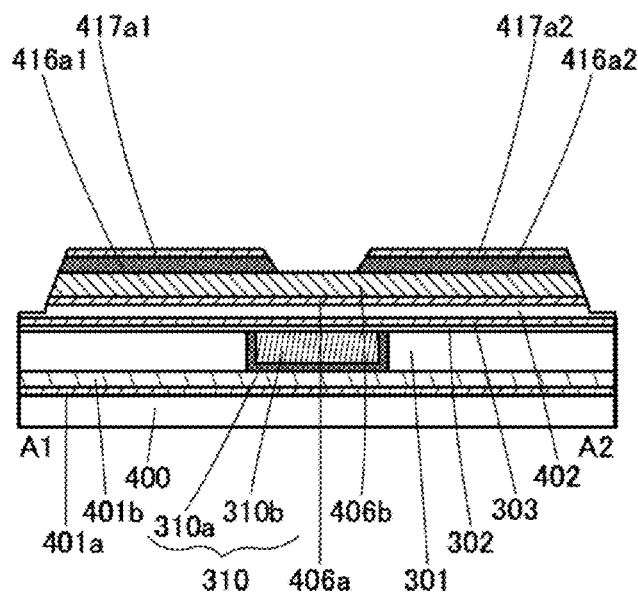
Figure 10A:
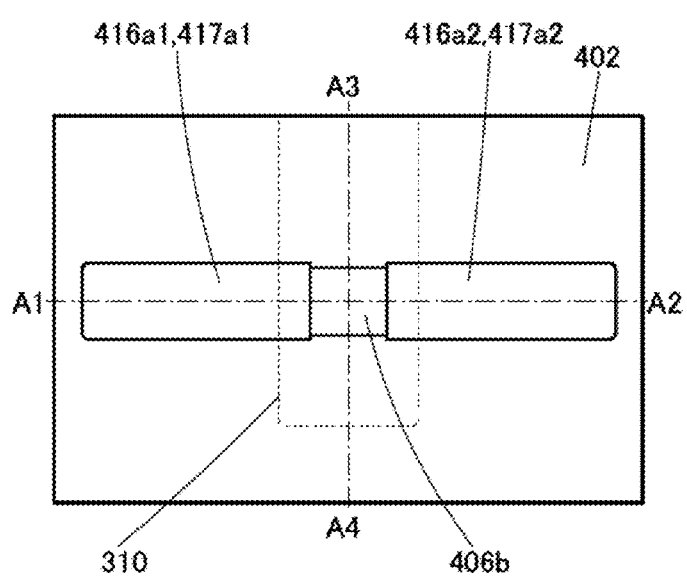
FIGS. 10A to 10C are a top view and cross-sectional views illustrating a method for manufacturing a transistor of one embodiment of the present invention.
Figure 10C:
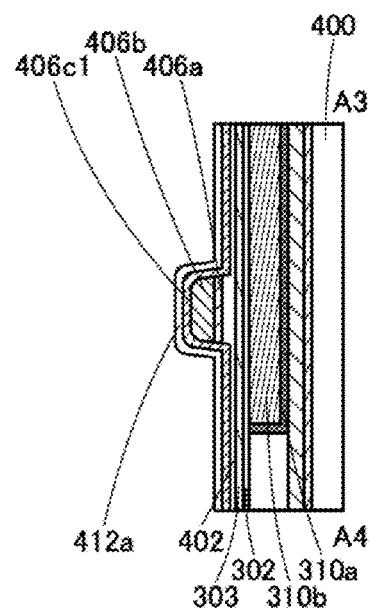
Figure 10B:
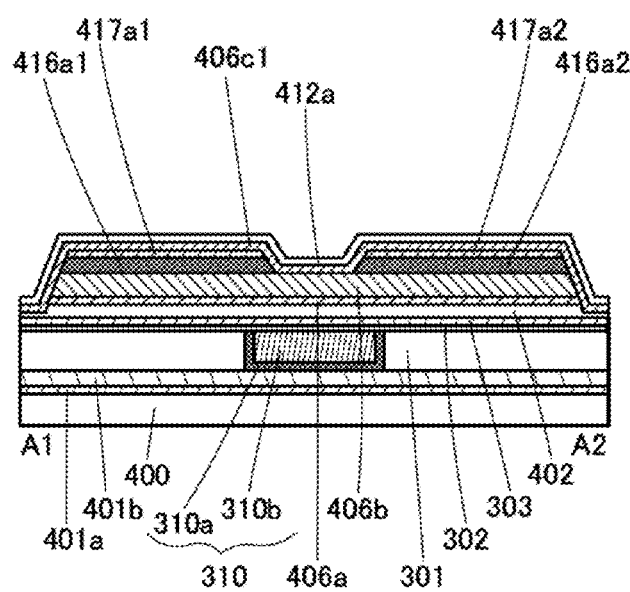

Next, the conductor 411a1, the conductor 411a2, and the exposed portion of the surface of the conductor 416a are etched, so that the conductor 416a1 and the conductor 416a2 are formed (see FIGS. 9A to 9C).

Then, washing treatment may be performed using an aqueous solution in which hydrofluoric acid is diluted with carbonated water or pure water (diluted hydrogen fluoride solution). In this embodiment, washing treatment is performed using a mixed solution of carbonated water and hydrofluoric acid. The concentration of hydrofluoric acid is approximately 70 ppm.

Next, third heat treatment may be performed. For the third heat treatment, the conditions for the first heat treatment can be used. In this embodiment, treatment is performed in a nitrogen atmosphere at 400° C. for 30 minutes, and another treatment is successively performed in an oxygen atmosphere at 400° C. for 30 minutes.

In some cases, dry etching performed in the above process causes the attachment or diffusion of an impurity due to an etching gas to a surface or an inside portion of the oxide 406a, the oxide 406b, or the like. Examples of the impurity include fluorine and chlorine.

The above treatment allows a reduction in impurity concentration. Furthermore, the moisture concentration and the hydrogen concentration in the oxide 406a and the oxide 406b can be reduced.

Next, an oxide 406c1 is formed. The oxide 406c1 can be formed by a sputtering method, a CVD method, an MBE method, a PLD method, an ALD method, or the like. A sputtering method is especially preferred for the deposition. Furthermore, sputtering conditions are as follows: a mixed gas of oxygen and argon is used; the oxygen partial pressure is preferably high, further preferably only oxygen is used; and the deposition temperature is room temperature or higher than or equal to 100° C. and lower than or equal to 200° C.

The oxide 406c1 is preferably deposited under the above conditions, in which case excess oxygen can be added to the oxide 406a, the oxide 406b, and the insulator 402.

Next, an insulator 412a is formed over the oxide 406c1. The insulator 412a can be formed by a sputtering method, a CVD method, an MBE method, a PLD method, an ALD method, or the like (see FIGS. 10A to 10C).

Here, fourth heat treatment can be performed. For this heat treatment, the conditions for the first heat treatment can be used. The heat treatment can reduce the moisture concentration and the hydrogen concentration in the insulator 412a. In this embodiment, the fourth heat treatment is performed in a nitrogen atmosphere at 400° C. for one hour.

Next, a conductor to be the conductor 404 is formed. The conductor to be the conductor 404 can be formed by a sputtering method, a CVD method, an MBE method, a PLD method, an ALD method, or the like.

The conductor 404 may be a multilayer film including, for example, the conductor 404a, the conductor 404b, and the conductor 404c. For example, as a conductor to be the conductor 404a, an oxide is deposited under conditions similar to those for the oxide 406c1, whereby oxygen can be added to the insulator 412a. Note that oxygen added to the insulator 412a serves as excess oxygen.

Then, a conductor to be the conductor 404b is deposited over the oxide by a sputtering method. As a result, the electric resistivity of the oxide is decreased, whereby the oxide can be the conductor to be the conductor 404a. Furthermore, a conductor to be the conductor 404c may be deposited over the conductor to be the conductor 404b by a sputtering method or the like. In this embodiment, the oxide is deposited by a sputtering method as the conductor to be the conductor 404a, titanium nitride is deposited by a sputtering method as the conductor to be the conductor 404b, and tungsten is deposited by a sputtering method as the conductor to be the conductor 404c.

Here, fifth heat treatment can be performed. For the fifth heat treatment, the conditions for the first heat treatment can be used. In this embodiment, the fifth heat treatment is performed in a nitrogen atmosphere at 400° C. for one hour.

Figure 11A:
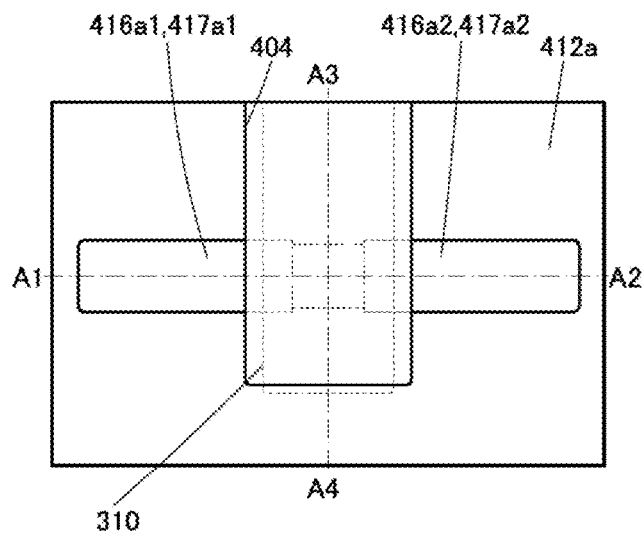
FIGS. 11A to 11C are a top view and cross-sectional views illustrating a method for manufacturing a transistor of one embodiment of the present invention.
Figure 11C:
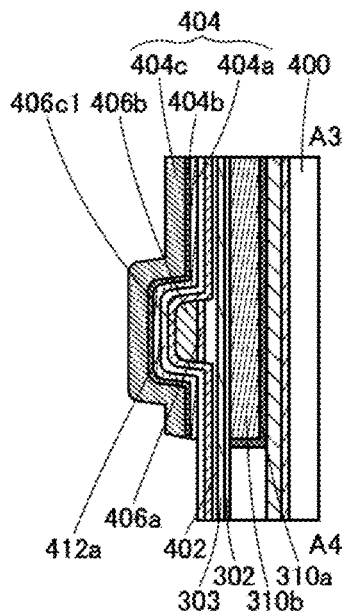
Figure 11B:
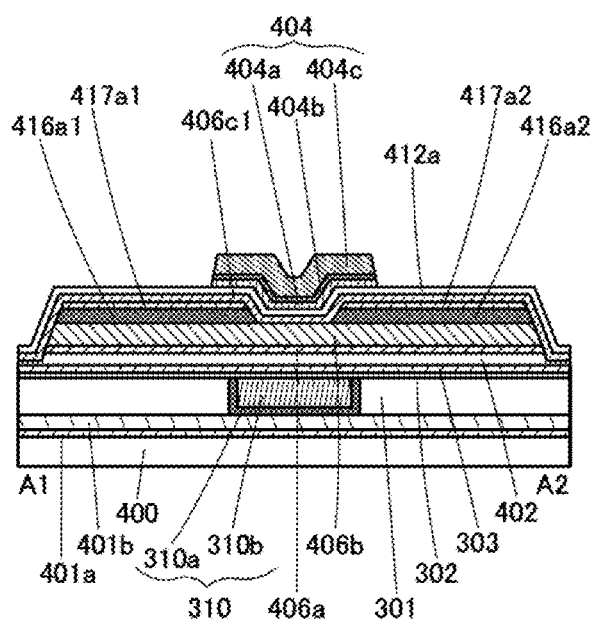
Figure 12A:
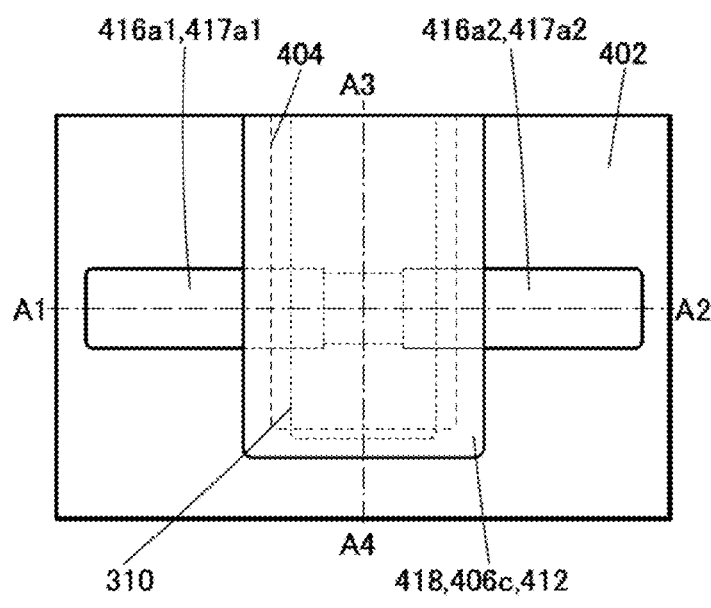
FIGS. 12A to 12C are a top view and cross-sectional views illustrating a method for manufacturing a transistor of one embodiment of the present invention.
Figure 12C:
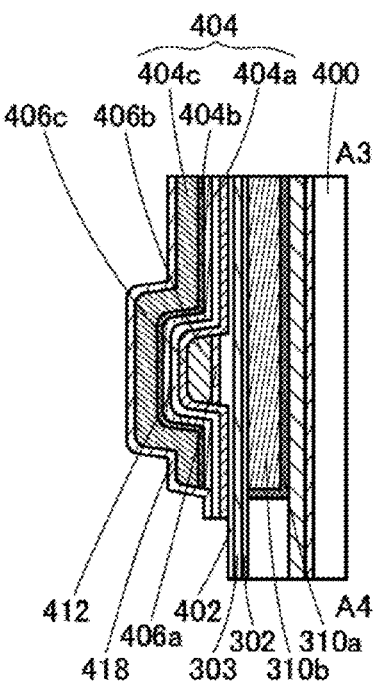
Figure 12B:
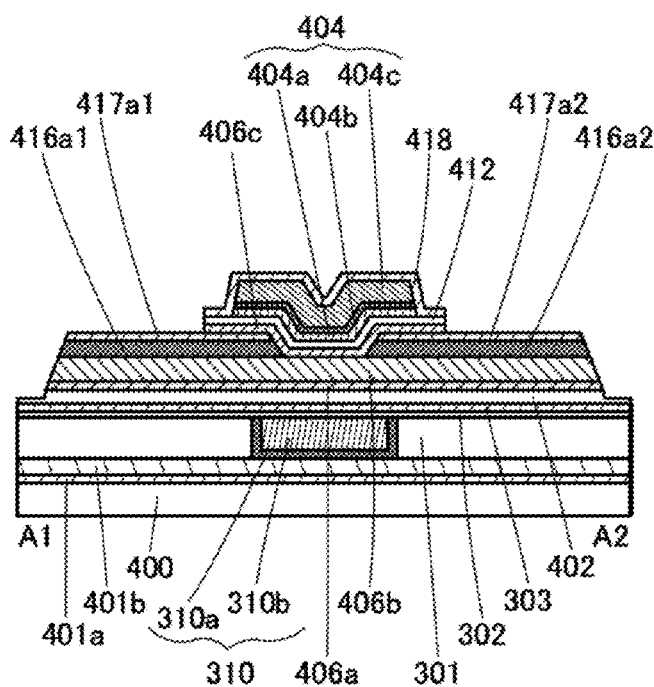

The conductors to be the conductors 404a, 404b, and 404c are processed by a lithography method to form the conductors 404a, 404b, and 404c (see FIGS. 11A to 11C).

Next, an oxide to be the oxide 418 may be deposited. The oxide to be the oxide 418 is preferably formed using a metal oxide, which can be deposited by a sputtering method, a CVD method, an MBE method, a PLD method, an ALD method, or the like. For example, in the case where aluminum oxide is deposited by an ALD method, the oxide to be the oxide 418 can be formed to have few pinholes and uniform thickness on the top and side surfaces of the conductor 404, resulting in prevention of oxidation of the conductor 404. In this embodiment, aluminum oxide is deposited by an ALD method.

Next, the oxide to be the oxide 418, the insulator 412a, and the oxide 406c1 are processed by a lithography method to form the oxide 418, the insulator 412, and the oxide 406c. Here, the end portions of the oxide 418, the end portions of the insulator 412, and the end portions of the oxide 406c are aligned and positioned over the barrier film 417a1 and the barrier film 417a2 in the cross-sectional view in the channel length direction, while the end portion of the oxide 418, the end portion of the insulator 412, and the end portion of the oxide 406c are aligned and positioned over the insulator 402 in the cross-sectional view in the channel width direction (see FIGS. 12A to 12C).

Next, the oxide 408a and the oxide 408b are formed. The oxide 408a and the oxide 408b are preferably formed using a metal oxide, which can be formed by a sputtering method, a CVD method, an MBE method, a PLD method, an ALD method, or the like.

When aluminum oxide is deposited by a sputtering method with the use of oxygen plasma for the oxide 408a, oxygen can be added to the insulator 402. The added oxygen serves as excess oxygen in the insulator 402, and the excess oxygen is effectively added to the oxide 406b including the channel formation region from the insulator 402 by heat treatment performed after the deposition of the oxide 408a, whereby defects in the channel formation region can be repaired.

When aluminum oxide is deposited by an ALD method for the oxide 408b, the oxide 408b can have few pinholes and uniform thickness, whereby entry of impurities such as hydrogen from the outside can be prevented. In addition, outside diffusion of the oxygen added to the oxide 406b can be prevented. In this embodiment, aluminum oxide is deposited by a sputtering method for the oxide 408a and aluminum oxide is deposited by an ALD method for the oxide 408b (see FIGS. 13A to 13C).

The steps described above are common to the manufacturing processes of the transistors 100 and 200. Next, a resist mask is formed over the transistor 100 by a lithography method and the oxides 408a and 408b only over the transistor 200 are etched (see FIGS. 14A to 14C).

Next, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. Note that the top surface of the insulator 410 is not necessarily flat.

Next, the oxide 420 and the oxide 422 are formed over the insulator 410. The oxides 420 and 422 are each preferably formed using a metal oxide, which can be formed by a sputtering method, a CVD method, an MBE method, a PLD method, an ALD method, or the like.

When aluminum oxide is deposited by a sputtering method with the use of oxygen plasma for the oxide 420, oxygen can be added to the insulator 410. The added oxygen serves as excess oxygen in the insulator 410.

Since the transistor 200 does not include the oxides 408a and 408b, by heat treatment after the formation of the oxide 420, the excess oxygen is added to the oxide 406b including the channel formation region through a path 1 from the insulator 410 via the insulator 412 and the oxide 406c, and through a path 2 from the insulator 410 via the insulator 402 and the oxide 406a. The excess oxygen is added to the oxide 406b through these two paths, whereby defects in the channel formation region can be repaired.

When aluminum oxide is deposited by an ALD method for the oxide 422, the oxide 422 can have few pinholes and uniform thickness, whereby entry of impurities such as hydrogen from the outside can be prevented. In addition, the oxygen added to the channel formation region can be prevented from being diffused to the outside through the oxide 420. In this embodiment, aluminum oxide is deposited by a sputtering method for the oxide 420, and aluminum oxide is deposited by an ALD method for the oxide 422.

Through the above steps, the transistor 100 including the oxide 408a and the oxide 408b and the transistor 200 not including the oxide 408a and the oxide 408b can be manufactured over one substrate (see FIGS. 1A to 1C and FIGS. 2A to 2C).

<Method 2 for Manufacturing Transistor>

Figure 15A:
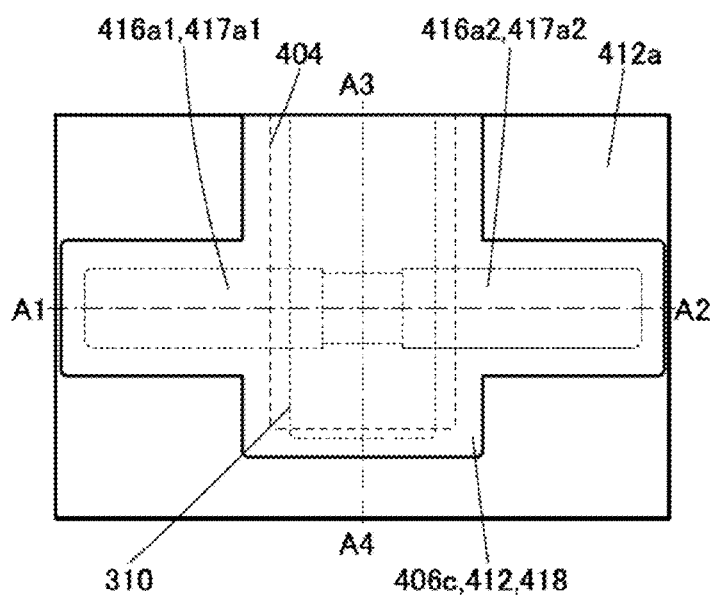
FIGS. 15A to 15C are a top view and cross-sectional views illustrating a method for manufacturing a transistor of one embodiment of the present invention.
Figure 15C:
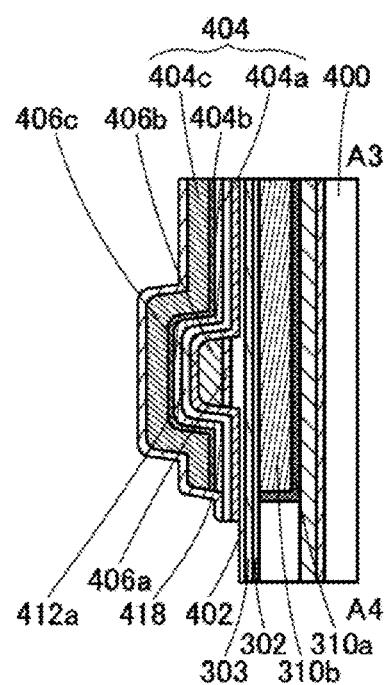
Figure 15B:
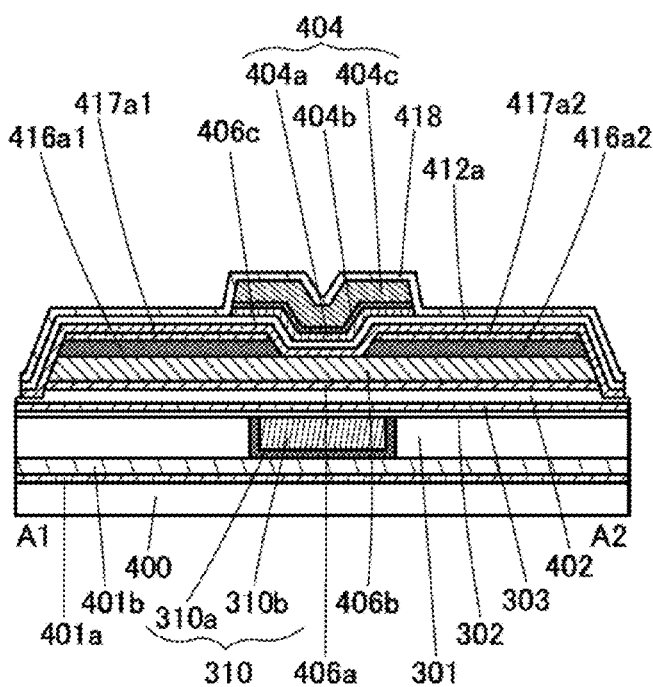
Figure 16A:
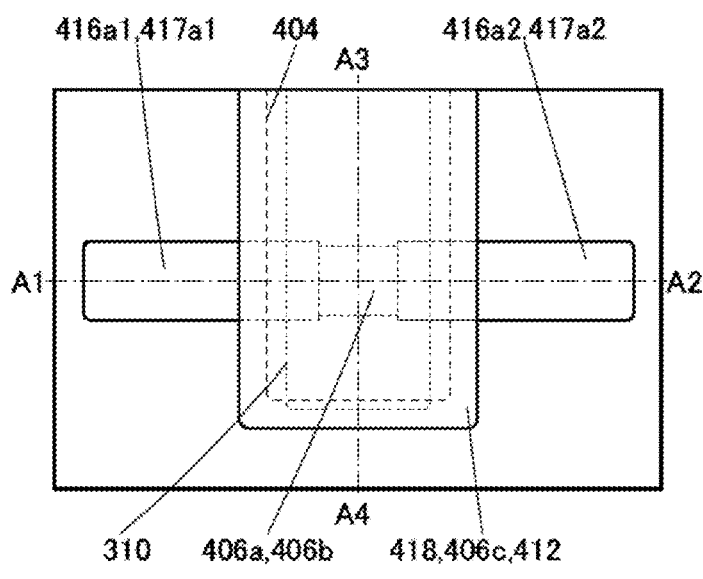
FIGS. 16A to 16C are a top view and cross-sectional views illustrating a method for manufacturing a transistor of one embodiment of the present invention.
Figure 16C:
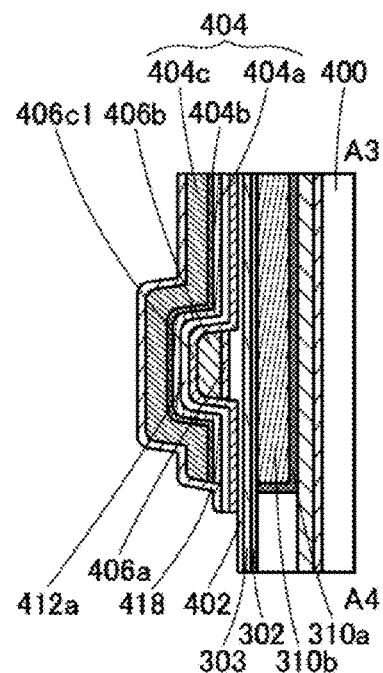
Figure 16B:
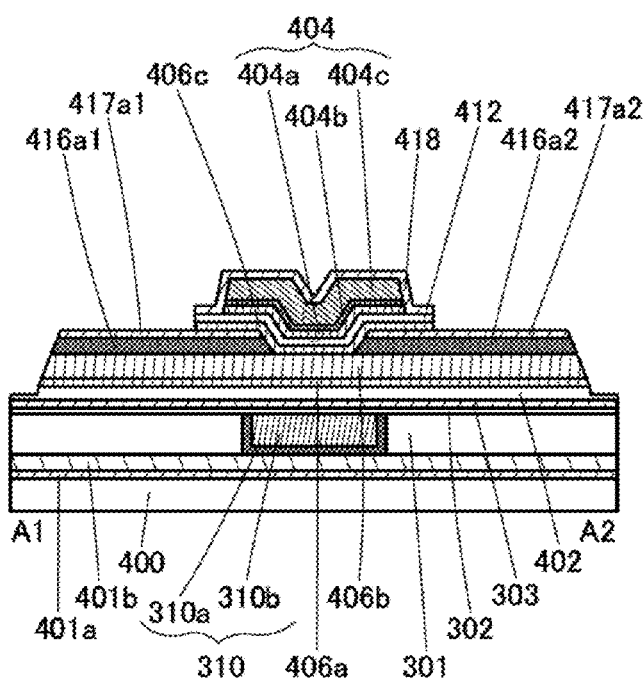

A method for manufacturing the transistors 100A and 200A of the present invention is described below with reference to FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 1A to 11C, FIGS. 15A to 15C, and FIGS. 16A to 16C. Note that FIG. 5A to FIG. 11C illustrate manufacturing steps common to the transistors 100A and 200A, FIGS. 15A to 15C illustrate a step of manufacturing the transistor 100A, and FIGS. 16A to 16C illustrate a step of manufacturing the transistor 200A. FIG. 3A, FIG. 4A, FIG. 5A, FIG. 6A, FIG. 7A, FIG. 8A, FIG. 9A, FIG. 10A, FIG. 11A, FIG. 15A, and FIG. 16A are top views. FIG. 3B, FIG. 4B, FIG. 5B, FIG. 6B, FIG. 7B, FIG. 8B, FIG. 9B, FIG. 10B, FIG. 11B, FIG. 15B, and FIG. 16B are cross-sectional views taken along the dashed-dotted lines A1-A2 in FIG. 3A, FIG. 4A, FIG. 5A, FIG. 6A, FIG. 7A, FIG. 8A, FIG. 9A, FIG. 10A, FIG. 11A, FIG. 15A, and FIG. 16A. FIG. 3C, FIG. 4C, FIG. 5C, FIG. 6C, FIG. 7C, FIG. 8C, FIG. 9C, FIG. 10C, FIG. 11C, FIG. 15C, and FIG. 16C are cross-sectional views taken along the dashed-dotted lines A3-A4 in FIG. 3A, FIG. 4A, FIG. 5A, FIG. 6A, FIG. 7A, FIG. 8A, FIG. 9A, FIG. 10A, FIG. 11A, FIG. 15A, and FIG. 16A. In FIG. 3B, FIG. 4B, FIG. 5B, FIG. 6B, FIG. 7B, FIG. 8B, FIG. 9B, FIG. 10B, FIG. 11B, FIG. 15B, and FIG. 16B, the cross-sectional views along A1-A2 are taken in the channel length direction of the transistor, and in FIG. 3C, FIG. 4C, FIG. 5C, FIG. 6C, FIG. 7C, FIG. 8C, FIG. 9C, FIG. 10C, FIG. 11C, FIG. 15C, and FIG. 16C, and FIG. 14C, the cross-sectional views along A3-A4 are taken in the channel width direction of the transistor.

The transistor 100A and the transistor 200A can be manufactured by the same method as the method for manufacturing the transistor 100 and the transistor 200 up to the steps illustrated in FIGS. 11A to 11C in which the conductor 404a, the conductor 404b, and the conductor 404c are formed (see FIGS. 11A to 11C).

Next, an oxide to be the oxide 418 is deposited. The oxide to be the oxide 418 is preferably formed using a metal oxide, which can be deposited by a sputtering method, a CVD method, an MBE method, a PLD method, an ALD method, or the like. For example, in the case where aluminum oxide is deposited by an ALD method, the oxide to be the oxide 418 can be formed to have few pinholes and uniform thickness on the top and side surfaces of the conductor 404, resulting in prevention of oxidation of the conductor 404. In this embodiment, aluminum oxide is deposited by an ALD method.

Next, an etching mask is formed by a lithograph method. Here, different etching masks are formed for the transistor 100A and the transistor 200A.

In the transistor 100A, the end portions of the oxide 418, the end portions of the insulator 412, and the end portions of the oxide 406c are aligned and positioned over the insulator 402 in the cross-sectional view in the channel length direction, while the end portion of the oxide 418, the end portion of the insulator 412, and the end portion of the oxide 406c are also aligned and positioned over the insulator 402 in the cross-sectional view in the channel width direction. The oxide 406c covers the barrier film 417a1 and the barrier film 417a2 and includes the region in contact with the side surface of the oxide 406a, the side surface of the oxide 406b, and the top surface of the insulator 402. With this structure, the oxide 418 can be formed to have few pinholes and uniform thickness on the top and side surfaces of the conductor 404, preventing oxidation of the conductor 404. Moreover, entry of impurities such as hydrogen from the outside into the channel formation region can be prevented (see FIGS. 15A to 15C).

In the transistor 200A, the end portions of the oxide 418, the end portions of the insulator 412, and the end portions of the oxide 406c are aligned and positioned over the barrier film 417a1 and the barrier film 417a2 in the cross-sectional view in the channel length direction, while the end portion of the oxide 418, the end portion of the insulator 412, and the end portion of the oxide 406c are aligned and positioned over the insulator 402 in the cross-sectional view in the channel width direction. With this structure, the oxide 418 can be formed to have few pinholes and uniform thickness on the top and side surfaces of the conductor 404, preventing oxidation of the conductor 404. Moreover, entry of impurities such as hydrogen from the outside into the channel formation region can be prevented (see FIGS. 16A to 16C).

In this manner, the oxide 418 of the transistor 100A and the oxide 418 of the transistor 200 can be formed by one lithography to have different shapes.

Next, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. However, the top surface of the insulator 410 is not necessarily flat.

Next, the oxide 420 and the oxide 422 are formed over the insulator 410. The oxides 420 and 422 are each preferably formed using a metal oxide, which can be formed by a sputtering method, a CVD method, an MBE method, a PLD method, an ALD method, or the like.

When aluminum oxide is deposited by a sputtering method with the use of oxygen plasma for the oxide 420, oxygen can be added to the insulator 410. The added oxygen serves as excess oxygen in the insulator 410.

In the transistor 100A, the oxide 418 is formed to cover the whole oxide 406b. Accordingly, the excess oxygen in the insulator 410 can be added to the oxide 406b including the channel formation region through the insulator 402 by heat treatment after the formation of the oxide 420, so that defects in the channel formation region can be repaired.

In contrast, in the transistor 200A, the oxide 418 is formed to cover the conductor 404. Accordingly, by heat treatment after the formation of the oxide 420, the excess oxygen in the insulator 410 is added to the oxide 406b including the channel formation region through the path 1 from the insulator 410 via the insulator 412 and the oxide 406c, and through the path 2 from the insulator 410 via the insulator 402 and the oxide 406a. The excess oxygen is added to the oxide 406b through these two paths, whereby defects in the channel formation region can be repaired.

When aluminum oxide is deposited by an ALD method for the oxide 422, the oxide 422 can have few pinholes and uniform thickness, whereby entry of impurities such as hydrogen from the outside can be prevented. In addition, the oxygen added to the channel formation region can be prevented from being diffused to the outside through the oxide 420. In this embodiment, aluminum oxide is deposited by a sputtering method for the oxide 420, and aluminum oxide is deposited by an ALD method for the oxide 422.

In this manner, the transistor 100A and the transistor 200A including the oxides 418 having different shapes can be manufactured over one substrate (see FIGS. 3A to 3C and FIGS. 4A to 4C).

This embodiment can be implemented in an appropriate combination with any of the structures described in the other embodiments, Examples, and the like.

Embodiment 3

<Structure of Semiconductor Device>

In this embodiment, an example of a semiconductor device including any of the transistors disclosed in this specification and the like is described.

Figure 17:
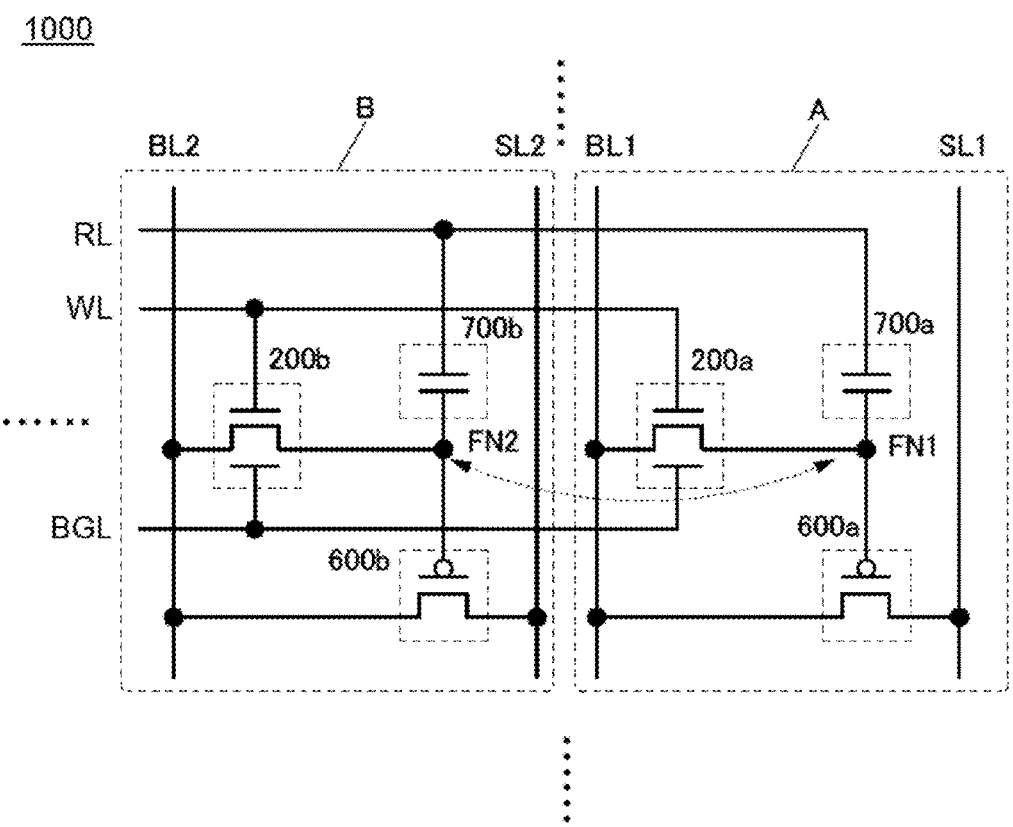
FIG. 17 is a circuit diagram of a semiconductor device of one embodiment of the present invention.

FIG. 17 is a circuit diagram illustrating part of a memory cell array included in a semiconductor device 1000. FIG. 17 illustrates a circuit diagram of two memory cells, a memory cell A and a memory cell B, and the memory cell A is a memory cell at a right end of the memory cell array. The memory cell included in the semiconductor device 1000 are repeatedly provided in the upper, lower, and left directions (denoted by dotted lines in FIG. 17).

The memory cell A includes a transistor 200a including a first gate electrode and a second gate electrode, a transistor 600a, a capacitor 700a, and a node FN1. Furthermore, the memory cell B includes a transistor 200b including a first gate electrode and a second gate electrode, a transistor 600b, a capacitor 700b, and a node FN2. The connection region of one of a source electrode and a drain electrode of the transistor 200a and one electrode of the capacitor 700a can be referred to as the node FN1. Furthermore, the connection region of one of a source electrode and a drain electrode of the transistor 200b and one electrode of the capacitor 700b can be referred to as the node FN2.

In the memory cell A, the first gate electrode of the transistor 200a is electrically connected to a wiring WL; the second gate electrode of the transistor 200a is electrically connected to a wiring BGL; the other of the source electrode and the drain electrode of the transistor 200a is electrically connected to a wiring BL1; and the one of the source electrode and the drain electrode of the transistor 200a is electrically connected to the node FN1. The other electrode of the capacitor 700a is electrically connected to a wiring RL and the one electrode of the capacitor 700a is electrically connected to the node FN1. A gate electrode of the transistor 600a is electrically connected to the node FN1; one of a source electrode and a drain electrode of the transistor 600a is electrically connected to a wiring SL1; and the other of the source electrode and the drain electrode of the transistor 600a is electrically connected to the wiring BL1.

In the memory cell B, the first gate electrode of the transistor 200b is electrically connected to the wiring WL; the second gate electrode of the transistor 200b is electrically connected to the wiring BGL; the other of the source electrode and the drain electrode of the transistor 200b is electrically connected to a wiring BL2; and the one of the source electrode and the drain electrode of the transistor 200b is electrically connected to the node FN2. The other electrode of the capacitor 700b is electrically connected to the wiring RL and the one electrode of the capacitor 700b is electrically connected to the node FN2. A gate electrode of the transistor 600b is electrically connected to the node FN2; one of a source electrode and a drain electrode of the transistor 600b is electrically connected to a wiring SL2; and the other of the source electrode and the drain electrode of the transistor 600b is electrically connected to the wiring BL2.

The first gate electrode of the transistor 200a of the memory cell A and the first gate electrode of the transistor 200b of the adjacent memory cell B are both electrically connected to the wiring WL. Furthermore, the second gate electrode of the transistor 200a of the memory cell A and the second gate electrode of the transistor 200b of the adjacent memory cell B are both electrically connected to the wiring BGL. Furthermore, the other electrode of the capacitor 700a of the memory cell A and the other electrode of the capacitor 700b of the adjacent memory cell B are both electrically connected to the wiring RL.

The transistors 200a and 200b preferably have small off-state current. For example, the off-state current of the transistors 200a and 200b is preferably smaller than or equal to $10^{-18}$ A/μm, further preferably smaller than or equal to $10^{-21}$ A/μm, still further preferably smaller than or equal to $10^{-24}$ A/μm. An oxide semiconductor transistor can be used as a transistor having small off-state current.

The transistors 600a and 600b preferably have little variation in the threshold voltage. Specifically, a transistor including single crystal silicon can be used.

The memory cells A and B utilize a characteristic in which electric charge of the nodes FN1 and FN2 can be retained, so that data can be written, retained, and read as follows.

Data writing and data retention are described using the memory cell A. First, a potential is supplied to the wiring WL so that the transistor 200a is turned on. Accordingly, the potential of the wiring BL1 is supplied to the node FN1. In other words, predetermined electric charge is supplied to the node FN1 (data writing). Here, electric charge for applying either of two different potential levels (hereinafter referred to as a Low level and a High level) is given. After that, the transistor 200a is turned off, so that the electric charge supplied to the node FN1 is retained (data retention).

Since the off-state current of the transistor 200a is extremely small, electric charge of the gate of the transistor 600a is retained for a long time. Here, when a negative potential is supplied to the second gate electrode of the transistor 200a through the wiring BGL, the threshold value of the transistor 200a shifts in a positive direction, so that the off-state current of the transistor 200a can be further reduced.

Next, reading of data is described. An appropriate potential (reading potential) is supplied to the wiring RL while a predetermined potential (constant potential) is supplied to the wiring SL1, so that the potential of the wiring BL1 varies depending on the amount of electric charge retained in the gate of the transistor 600a. This is because in the case where the transistor 600a is a p-channel transistor, apparent threshold voltage $V_{th\_H}$ when a High level is supplied to the node FN1 is usually lower than apparent threshold voltage $V_{th\_L}$ when a Low level is supplied to the node FN1. Here, the apparent threshold voltage refers to the potential of the wiring RL that is needed to turn on the transistor 600a. Thus, when the potential of the wiring RL is set to a potential $V_0$ that is between $V_{th\_H}$ and $V_{th\_L}$, electric charge supplied to the gate of the transistor 600a can be determined. For example, in the case where the Low level is supplied in data writing, the transistor 600a is turned on when the potential of the node FN1 is $V_0$ ($<V_{th\_L}$). In the case where the High level is supplied in data writing, the transistor 600a remains in an off state even when the potential of the node FN1 is set to $V_0$ ($>V_{th\_H}$). Therefore, the retained data can be read by determining the potential of the wiring BL1.

Note that although the transistor 600a is a p-channel transistor in the above description, one embodiment of the present invention is not limited thereto, and the transistor 600a might be an n-channel transistor.

<Cross-Sectional View>

Figure 18:
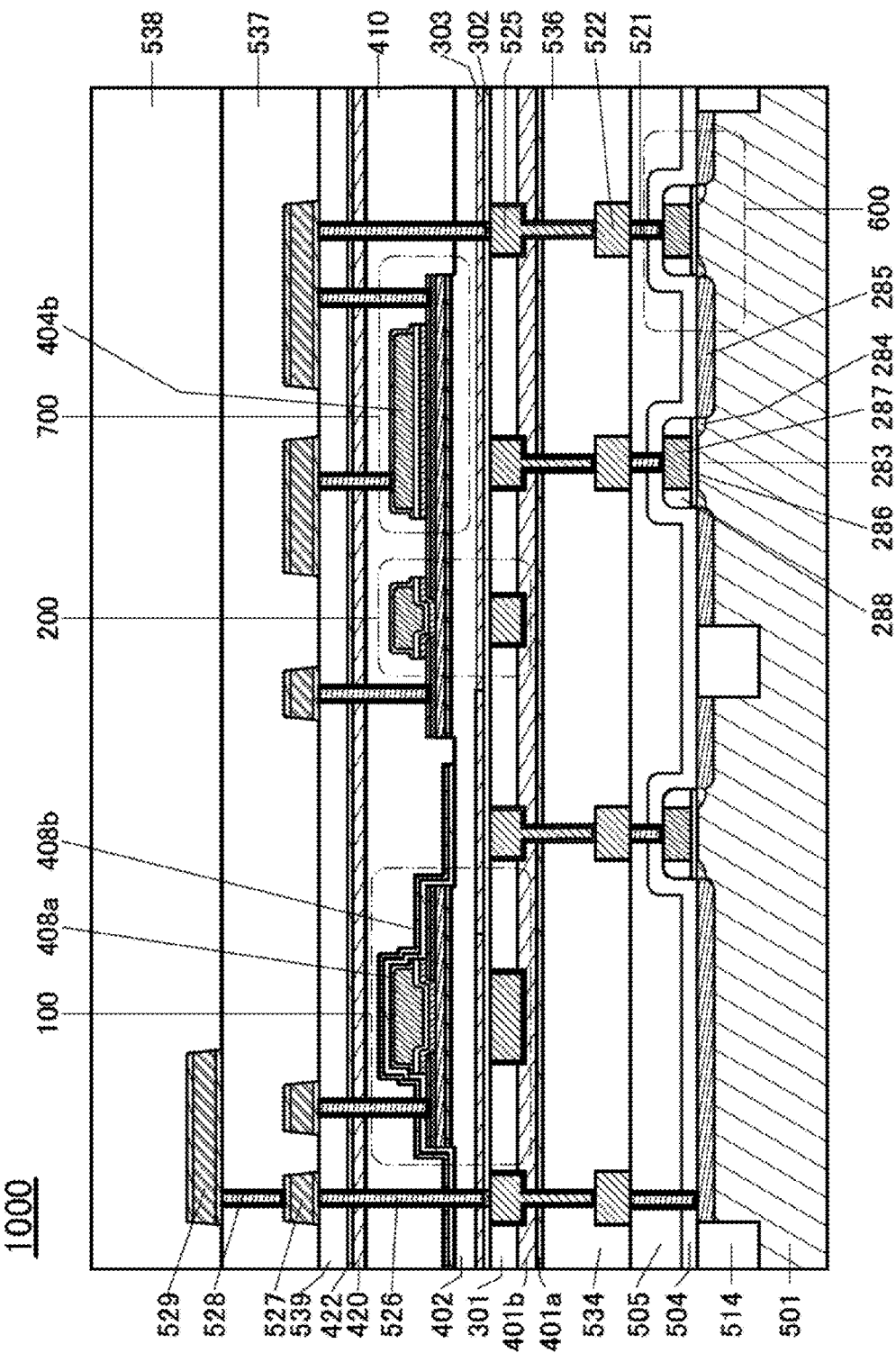
FIG. 18 is a cross-sectional view of a semiconductor device of one embodiment of the present invention.

FIG. 18 is a cross-sectional view of the semiconductor device 1000. The semiconductor device 1000 includes the transistor 100, the transistor 200, a transistor 600, and a capacitor 700. The transistor 200, the transistor 600, and the capacitor 700 correspond to the transistor 200a, the transistor 600a, and the capacitor 700a illustrated in FIG. 17, respectively. The transistor 200 is a transistor included in the memory cell. The transistor 100 is an example of a transistor included in a circuit for controlling the memory cell. The transistor 100 has a size different from that of the transistor 200 and is larger than the transistor 200.

In the semiconductor device 1000, an n-type semiconductor is used for a substrate 501. The transistor 600 includes a channel formation region 283, high-concentration p-type impurity regions 285, an insulator 286, a conductor 287, and a sidewall 288. In regions overlapping with the sidewall 288 with the insulator 286 located therebetween, low-concentration p-type impurity regions 284 are provided. The insulator 286 can function as a gate insulator. The conductor 287 can function as a gate conductor. The channel formation region 283 of the transistor 600 is formed in part of the substrate 501.

The low-concentration p-type impurity regions 284 can be formed in such a manner that an impurity element is added with the use of the conductor 287 as a mask after formation of the conductor 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 600 is electrically isolated from other transistors by an element isolation region 514. The element isolation region 514 can be formed by a local oxidation of silicon (LOCOS) method, a shallow trench isolation (STI) method, or the like.

In the semiconductor device 1000, an insulator 505 and an insulator 534 are provided over an insulator 504 covering the transistor 600. In addition, the semiconductor device 1000 includes a conductor 522 over the insulator 505.

The conductor 522 is electrically connected to the transistor 600 through a conductor 521 provided in the insulators 504 and 505.

The semiconductor device 1000 includes the transistor 100, the transistor 200, and the capacitor 700 over the insulator 534 with the oxide 401a, the oxide 401b, the insulator 301, the insulator 302, the insulator 303, and the insulator 402 therebetween. The oxide 408a and the oxide 408b are provided over the transistor 100, while the oxide 408a and the oxide 408b are not provided over the transistor 200. In other words, the transistor 100 and the transistor 200 are manufactured to have different structures.

The insulator 410, the oxide 420, the oxide 422, and an insulator 539 are provided over the transistor 100, the transistor 200, and the capacitor 700, and a conductor 527 is provided over the insulator 539. Furthermore, an insulator 537 covering the conductor 527 is provided.

One of a source electrode and a drain electrode of the transistor 200 functions as one electrode of the capacitor 700, and the conductor 404b functions as the other electrode of the capacitor 700. A region where the one of the source electrode and the drain electrode of the transistor 200 and the conductor 404b overlap with each other functions as the capacitor 700.

The conductor 527 is electrically connected to the source electrode or the drain electrode of the transistor 200 through a conductor 526 provided in part of the insulator 539, the oxide 422, the oxide 420, the insulator 410, and the barrier film 417a1. The conductor 527 is electrically connected to a source electrode or a drain electrode of the transistor 100 through the conductor 526 provided in part of the insulator 539, the oxide 422, the oxide 420, the insulator 410, the oxide 408b, the oxide 408a, and the barrier film 417a1.

A conductor 529 is provided over the insulator 537 and an insulator 538 is provided over the conductor 529. The conductor 529 is electrically connected to the conductor 527 through a conductor 528 provided in part of the insulator 537.

The oxide 401a, the oxide 401b, the insulator 301, the insulator 302, the insulator 303, the insulator 402, the oxide 420, the oxide 422, the insulator 534, the insulator 539, the insulator 537, and the insulator 538 can be formed using materials and methods similar to those of the oxides and the insulators described in the above embodiments and the like. The conductors 521, 522, 525, 526, 527, and 529 can be formed using a material and a method similar to those of the conductors described in the above embodiments and the like.

The conductors 521, 522, 525, 526, 527, 528, and 529 may be formed by a damascene method, a dual damascene method, or the like.

According to one embodiment of the present invention, when the transistors 100 larger than the transistors 200 in a circuit have different structures from the transistors 200 provided at a high density in another circuit, variations in characteristics of the transistors 100 and 200 can be reduced, variations in electrical characteristics of the transistors included in each circuit can be suppressed, and the semiconductor device 1000 can have high performance.

This embodiment can be implemented in an appropriate combination with any of the structures described in the other embodiments, Examples, and the like.

Embodiment 4

<Electronic Device>

A semiconductor device of one embodiment of the present invention can be used for a variety of electronic devices. FIGS. 19A to 19G illustrate specific examples of the electronic devices including the semiconductor device of one embodiment of the present invention.

Figure 19A:
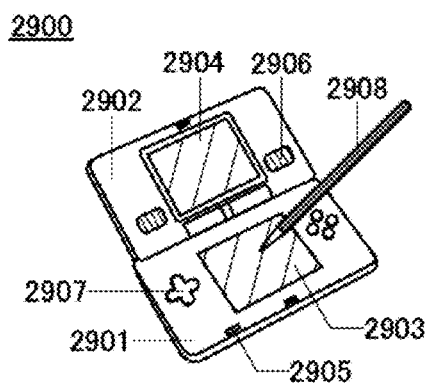
FIGS. 19A to 19G each illustrate an electronic device of one embodiment of the present invention.

A portable game machine 2900 illustrated in FIG. 19A includes a housing 2901, a housing 2902, a display portion 2903, a display portion 2904, a microphone 2905, a speaker 2906, an operation switch 2907, and the like. In the housing 2901 of the portable game machine 2900, an antenna, a battery, and the like are provided. Although the portable game machine in FIG. 19A has the two display portions 2903 and 2904, the number of display portions is not limited to this. The display portion 2903 is provided with a touch screen as an input device, which can be handled with a stylus 2908 or the like.

Figure 19B:
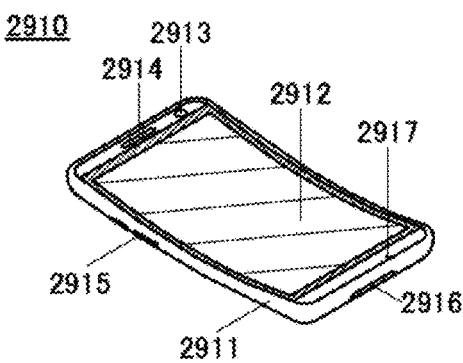

An information terminal 2910 illustrated in FIG. 19B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 19C:
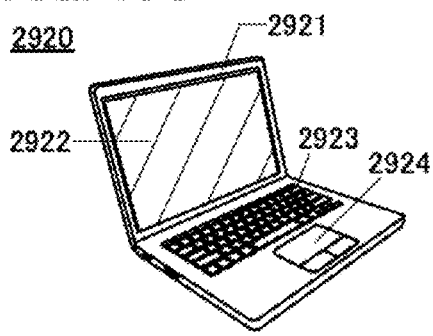

A notebook personal computer 2920 illustrated in FIG. 19C includes a housing 2921, a display portion 2922, a keyboard 2923, a pointing device 2924, and the like. In the housing 2921 of the notebook personal computer 2920, an antenna, a battery, and the like are provided.

Figure 19D:
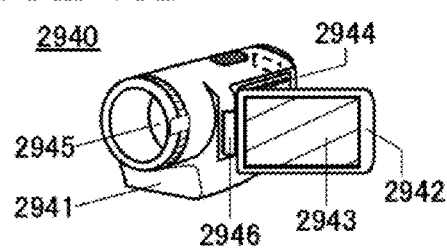

A video camera 2940 illustrated in FIG. 19D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 19E:
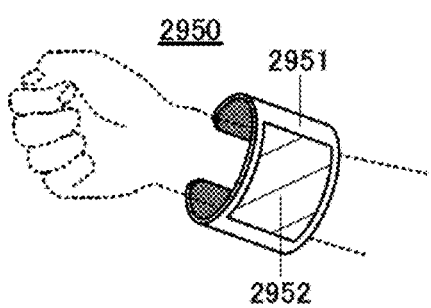

FIG. 19E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 19F:
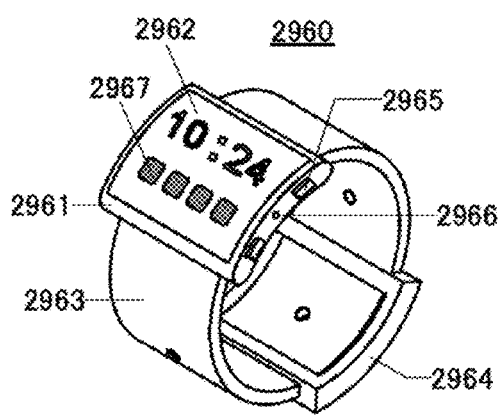

FIG. 19F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

Figure 19G:
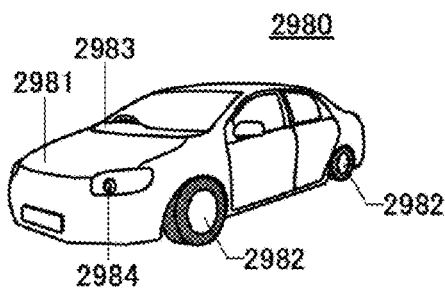

FIG. 19G is an external view illustrating an example of a car. A car 2980 includes a car body 2981, wheels 2982, a dashboard 2983, lights 2984, and the like. The car 2980 also includes an antenna, a battery, and the like.

For example, a memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments, Examples, and the like.

EXAMPLE 1

In this example, the transistor 100 illustrated in FIGS. 1A to 1C and the transistor 200 illustrated in FIGS. 2A to 2C, which are embodiments of the present invention, were fabricated, the electrical characteristics of the transistors were measured, and the influences of the size of transistors on electrical characteristics were compared. Note that the transistor 100 and the transistor 200 were fabricated over separate substrates.

In each of the transistors 100 and 200, a 400-nm-thick silicon oxide film was formed over a single crystal silicon wafer by a thermal oxidation method. Next, a 50-nm-thick silicon nitride film was formed over the silicon oxide film by a CVD method. Next, a 10-nm-thick first aluminum oxide film was formed by an ALD method. Next, a 40-nm-thick second aluminum oxide film was formed by a sputtering method.

Next, a 160-nm-thick first silicon oxynitride film was formed over the second aluminum oxide film by a CVD method, and a 35-nm-thick first tungsten film was formed over the first silicon oxynitride film by a sputtering method. Then, the first tungsten film was processed by a lithography method, and a hard mask including the first tungsten film was formed.

Subsequently, the first silicon oxynitride film was processed, so that a groove reaching the second aluminum oxide film was formed. In the groove, a first tantalum nitride film was formed by a sputtering method and a first titanium nitride film and a second tungsten film were formed over the first tantalum nitride film by an ALD method and a CVD method. Then, the second tungsten film, the first titanium nitride film, the first tantalum nitride film, and the first tungsten film were polished by first CMP treatment until the top surface of the first silicon oxynitride film was exposed, and the second tungsten film, the first titanium nitride film, and the first tantalum nitride film were embedded in the groove; accordingly, a wiring layer and a second gate electrode were formed.

Next, a 10-nm-thick second silicon oxynitride film was formed by a CVD method. A 20-nm-thick hafnium oxide film was formed by an ALD method. Then, a 30-nm-thick third silicon oxynitride film was formed by a CVD method. The second silicon oxynitride film, the hafnium oxide film, and the third silicon oxynitride film serve as a second gate insulating film. Next, first heat treatment was performed. The first heat treatment was performed in an atmosphere containing nitrogen at 400° C. for one hour.

Next, as a first oxide (S1), a 5-nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide (S2), a 20-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, second heat treatment was performed. As the second heat treatment, treatment was performed in an atmosphere containing nitrogen at 400° C. for one hour, and subsequently another treatment was performed in an atmosphere containing oxygen at 400° C. for one hour.

Next, a 30-nm-thick second tantalum nitride film was formed over the S2 by a sputtering method. Then, a 5-nm-thick third aluminum oxide film was formed over the second tantalum nitride film by an ALD method. Next, a 15-nm-thick third tungsten film was formed over the third aluminum oxide film by a sputtering method.

Then, the third tungsten film and the third aluminum oxide film in a region where a channel was formed were etched by a lithography method. A dry etching method was used for the etching.

Then, a resist mask was formed, and the third tungsten film was etched by a lithography method with the use of the resist mask as an etching mask. A dry etching method was used for the etching. Next, the resist mask was removed using oxygen plasma, and unnecessary portions of the third aluminum oxide film, the second tantalum nitride film, the S2, and the S1 were sequentially etched. A dry etching method was used for the etching.

Then, the second tantalum nitride film in a region where the channel was formed was etched. The third tungsten film over the third aluminum oxide film was also etched by the etching. A dry etching method was used for the etching.

Then, third heat treatment was performed. As the third heat treatment, treatment was performed in an atmosphere containing nitrogen at 400° C. for 30 minutes, and subsequently another treatment was performed in an atmosphere containing oxygen at 400° C. for 30 minutes.

Next, as a third oxide (S3), a 5-nm-thick In—Ga—Zn oxide was formed by a sputtering method. The S3 was formed under the following conditions: a target having an atomic ratio of In:Ga:Zn=1:3:2 was used, the oxygen gas flow rate was 45 sccm, the pressure was 0.7 Pa, and the substrate temperature was room temperature.

Then, a 13-nm-thick fourth silicon oxynitride film functioning as a first gate oxide film was formed by a CVD method.

Then, fourth heat treatment was performed. The fourth heat treatment was performed in an atmosphere containing nitrogen at 400° C. for one hour.

Next, as a fourth oxide (S4), a 10-nm-thick In—Ga—Zn oxide was formed by a sputtering method. The fourth oxide was formed under the following conditions: a target having an atomic ratio of In:Ga:Zn=4:2:4.1 was used, the oxygen gas flow rate was 45 sccm, the pressure was 0.7 Pa, and the substrate temperature was 200° C.

Then, a 5-nm-thick second titanium nitride film was formed over the fourth oxide by a sputtering method, and a 50-nm-thick fourth tungsten film was formed over the second titanium nitride film by a sputtering method. The second titanium nitride film and the fourth tungsten film were successively formed.

Then, fifth heat treatment was performed. The fifth heat treatment was performed in an atmosphere containing nitrogen at 400° C. for one hour.

Next, the fourth tungsten film, the second titanium nitride film, and the S4 were etched in this order by a lithography method, so that a gate electrode was formed. A dry etching method was used for the etching of the fourth tungsten film and the second titanium nitride film, and a wet etching method was used for the etching of the fourth oxide.

Next, by a lithography method, parts of the fourth silicon oxynitride film and the S3 were etched. A dry etching method was used for the etching.

Next, a 7-nm-thick fourth aluminum oxide film was formed by an ALD method. The substrate temperature was 250° C.

Next, by a lithography method, part of the fourth aluminum oxide film was etched. The fourth aluminum oxide film was etched by a dry etching method.

Then, in the sample of the transistor 100, a 20-nm-thick fifth aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Next, in the sample of the transistor 100, a 5-nm-thick sixth aluminum oxide film was formed over the fifth aluminum oxide film by an ALD method. The substrate temperature was 250° C.

Note that in the transistor 200, the fifth aluminum oxide film and the sixth aluminum oxide film were not formed.

From this step, the sample of the transistor 100 and the sample of the transistor 200 were fabricated by the same process.

Next, a 450-nm-thick fifth silicon oxynitride film was formed by a CVD method. Then, second CMP treatment was performed to polish the fifth silicon oxynitride film so that the surface of the fifth silicon oxynitride film was planarized.

Then, a 40-nm-thick seventh aluminum oxide film was formed over the fifth silicon oxynitride film by a sputtering method under the following conditions: the argon gas flow rate was 25 sccm, the oxygen gas flow rate was 25 sccm, the pressure was 0.4 Pa, and the substrate temperature was 250° C.

Then, sixth heat treatment was performed. As the sixth heat treatment, treatment was performed in an atmosphere containing nitrogen at 400° C. for one hour, and subsequently another treatment was performed in an atmosphere containing oxygen at 400° C. for one hour.

Next, a 150-nm-thick sixth silicon oxynitride film was formed by a CVD method.

Then, a contact hole reaching the second tungsten film (second gate electrode), a contact hole reaching the fourth tungsten film (first gate electrode), and a contact hole reaching the second tantalum nitride film (source electrode and drain electrode) were formed by a lithography method. A 40-nm-thick third tantalum nitride film was formed by a sputtering method, a 5-nm-thick third titanium nitride film was formed by an ALD method, and a 250-nm-thick fifth tungsten film was formed by a CVD method.

Then, the fifth tungsten film, the third titanium nitride film, and the third tantalum nitride film were polished to reach the sixth silicon oxynitride film by third CMP treatment, so that the fifth tungsten film, the third titanium nitride film, and the third tantalum nitride film were embedded in each contact hole to form plugs.

Next, a first titanium film (with a thickness of 20 nm), a fourth titanium nitride film (with a thickness of 30 nm), an aluminum film (with a thickness of 100 nm), a second titanium film (with a thickness of 5 nm), and a fifth titanium nitride film (with a thickness of 45 nm) were successively formed in this order by a sputtering method. Next, the first titanium film, the fourth titanium nitride film, the aluminum film, the second titanium film, and the fifth titanium nitride film were partly etched by a lithography method to form a wiring layer.

Next, a 1.6-μm-thick photosensitive polyimide film was formed by a coating method. Next, a portion of the polyimide film to be a measurement terminal (measurement pad) was removed by a lithography method. Next, heat treatment was performed at 300° C. for one hour, so that the polyimide film was baked.

Through the above process, the transistors 100 and 200 were fabricated.

Then, the electrical characteristics of the transistors 100 and 200 were measured. The transistors 100 were provided on a 5-inch-square substrate, and the transistors 200 were provided on a 5-inch-square substrate.

The electrical characteristics of the transistors 100 and 200 were measured by measuring change in source-drain current (hereinafter referred to as a drain current $I_d$) when a source-gate voltage (hereinafter referred to as a gate voltage $V_g$) changed from −3.3 V to +3.3 V at a source-drain voltage (hereinafter referred to as a drain voltage $V_d$) of 0.1 V or 3.3 V. That is, $I_d$-$V_g$ characteristics were measured. Hereinafter, the gate voltage $V_g$ refers to the voltage of a first gate electrode (top gate electrode). In this measurement, the voltage of a second gate electrode (back gate electrode) was set to 0 V. In this measurement, the $I_d$-$V_g$ characteristics of eighteen transistors on each substrate were measured.

From the obtained measurement data of the $I_d$-$V_g$ characteristics, Vsh values at $V_d$=0.1 V were calculated. Note that Vsh is defined as $V_g$ at $I_d$=1.0×10$^{-12}$ A and can mean $V_g$ at which a transistor is turned on.

Figure 22A:
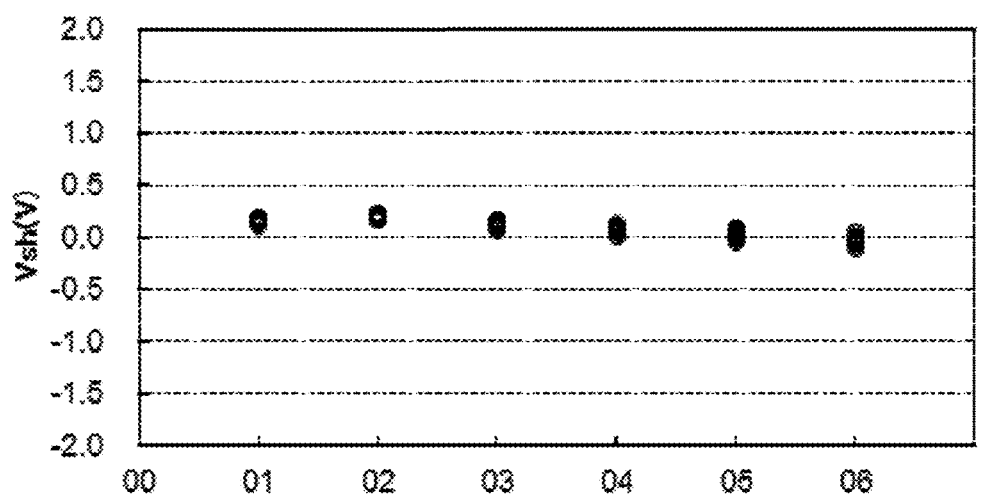
FIGS. 22A and 22B are graphs each showing the dependence of Vsh of a transistor of an example on its size.
Figure 22B:
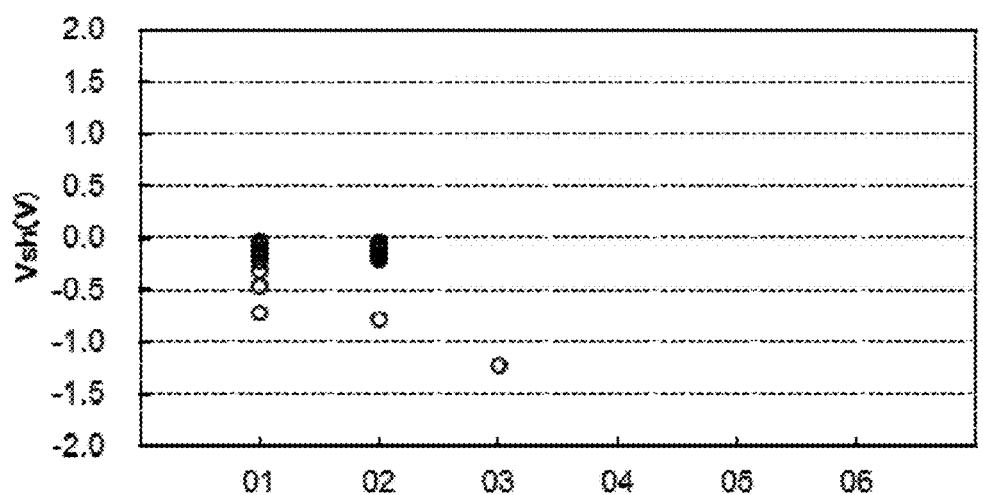

FIGS. 22A and 22B are graphs each showing the dependence of Vsh on the size of a transistor. In this example, the size of a transistor refers to the channel width. The channel lengths of the transistors were set to a design value of 0.3 μm, and Vsh values of transistors with various channel widths were compared. In each graph, the vertical axis represents Vsh and the horizontal axis represents the channel width. As for numbers on the horizontal axis, 01, 02, 03, 04, 05, and 06 represent Vsh values of transistors with designed channel widths of 0.35 μm, 0.5 μm, 1.5 μm, 3.0 μm, 5.0 μm, and 10.0 μm, respectively.

FIG. 22A is a graph showing the dependence of Vsh of the transistor 100 on the channel width. It is found from FIG. 22A that the Vsh values of the transistors 100 are within a range of approximately −0.1V to approximately 0.2 V regardless of the channel width, which indicates that the dependence on the channel width is small. It is also found that variation in the Vsh values of the transistors having the same channel width is small. For example, the variation, which is obtained by deducting the minimum Vsh value from the maximum Vsh value, is in a range of approximately 0.07 V to approximately 0.15 V. FIG. 22B is a graph showing the dependence of Vsh of the transistor 200 on the channel width. The Vsh values of the transistors with a channel width of 3.0 μm or larger vary greatly. The Vsh values of some of such transistors exceeded a range of −2.0 V to 2.0 V on the vertical axis and the Vsh values of others were not able to be measured. In addition, it is found that variations in the Vsh values of the transistors with a designed channel width of 0.35 μm and those of the transistors with a designed channel width of 0.5 μm are large. It is indicated that the structure of the transistor 200 causes dependence on the size of a transistor. As shown above, employing the structure of the transistor 100 can suppress variation in electrical characteristics of transistors regardless of size.

EXAMPLE 2

In this example, the transistor 100 illustrated in FIGS. 1A to 1C and the transistor 200 illustrated in FIGS. 2A to 2C, which are embodiments of the present invention, were fabricated, the electrical characteristics of the transistors were measured, and the influences of the transistor density on electrical characteristics were compared. Note that the transistor 100 and the transistor 200 were fabricated over separate substrates.

In each of the transistors 100 and 200, a 400-nm-thick silicon oxide film was formed over a single crystal silicon wafer by a thermal oxidation method. Next, a 40-nm-thick first aluminum oxide film was formed by a sputtering method.

Next, a 150-nm-thick first silicon oxynitride film was formed over the first aluminum oxide film by a CVD method, and a 35-nm-thick first tungsten film was formed over the first silicon oxynitride film by a sputtering method. Then, the first tungsten film was processed by a lithography method, and a hard mask including the first tungsten film was formed.

Subsequently, the first silicon oxynitride film was processed, so that a groove reaching the first aluminum oxide film was formed. In the groove, a first tantalum nitride film was formed by a sputtering method and a first titanium nitride film and a second tungsten film were formed over the first tantalum nitride film by an ALD method and a CVD method. Then, the second tungsten film, the first titanium nitride film, the first tantalum nitride film, and the first tungsten film were polished by first CMP treatment until the top surface of the first silicon oxynitride film was exposed, and the second tungsten film, the first titanium nitride film, and the first tantalum nitride film were embedded in the groove; accordingly, a wiring layer and a second gate electrode were formed.

Next, a 10-nm-thick second silicon oxynitride film was formed by a CVD method. A 20-nm-thick hafnium oxide film was formed by an ALD method. Then, a 30-nm-thick third silicon oxynitride film was formed by a CVD method. The second silicon oxynitride film, the hafnium oxide film, and the third silicon oxynitride film serve as a second gate insulating film. Next, first heat treatment was performed. As the first heat treatment, treatment was performed in an atmosphere containing nitrogen at 400° C. for one hour, and subsequently another treatment was performed in an atmosphere containing oxygen at 400° C. for one hour.

Next, as a first oxide (S1), a 5-nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide (S2), a 20-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, second heat treatment was performed. As the second heat treatment, treatment was performed in an atmosphere containing nitrogen at 400° C. for one hour, and subsequently another treatment was performed in an atmosphere containing oxygen at 400° C. for one hour.

Next, a 20-nm-thick second tantalum nitride film was formed over the S2 by a sputtering method. Then, a 5-nm-thick second aluminum oxide film was formed over the second tantalum nitride film by an ALD method. Next, a 15-nm-thick third tantalum nitride film was formed over the second aluminum oxide film by a sputtering method.

Then, the third tantalum nitride film and the second aluminum oxide film in a region where a channel was formed were etched by a lithography method. A dry etching method was used for the etching.

Then, a resist mask was formed, and the third tantalum nitride film was etched by a lithography method with the use of the resist mask as an etching mask. A dry etching method was used for the etching. Next, the resist mask was removed using oxygen plasma, and unnecessary portions of the second aluminum oxide film, the second tantalum nitride film, the S2, and the S1 were sequentially etched. A dry etching method was used for the etching.

Then, the second tantalum nitride film in a region where the channel was formed was etched. The third tantalum nitride film over the second aluminum oxide film was also etched by the etching. A dry etching method was used for the etching.

Next, as a third oxide (S3), a 5-nm-thick In—Ga—Zn oxide was formed by a sputtering method.

Then, a 10-nm-thick fourth silicon oxynitride film functioning as a first gate oxide film was formed by a CVD method.

Then, a 10-nm-thick second titanium nitride film was formed by a sputtering method, and a 30-nm-thick third tungsten film was formed over the second titanium nitride film by a sputtering method. The second titanium nitride film and the third tungsten film were successively formed.

Next, the third tungsten film and the second titanium nitride film were etched in this order by a lithography method, so that a gate electrode was formed. A dry etching method was used for the etching.

Next, a 7-nm-thick third aluminum oxide film was formed by an ALD method. The substrate temperature was 250° C.

Next, part of the third aluminum oxide film and part of the fourth silicon oxynitride film were etched by a lithography method. A dry etching method was used for the etching. Then, the S3 was etched. A diluted phosphoric acid solution was used for the etching of the S3.

Then, in the sample of the transistor 100, a 5-nm-thick fourth aluminum oxide film was formed by a sputtering method under the following conditions: the argon gas flow rate was 25 sccm, the oxygen gas flow rate was 25 sccm, the pressure was 0.4 Pa, and the substrate temperature was 130° C.

Next, in the sample of the transistor 100, a 5-nm-thick fifth aluminum oxide film was formed over the fourth aluminum oxide film by an ALD method. The substrate temperature was 250° C.

Note that in the transistor 200, the fourth aluminum oxide film and the fifth aluminum oxide film were not formed.

From this step, the sample of the transistor 100 and the sample of the transistor 200 were fabricated by the same process.

Next, a 310-nm-thick fifth silicon oxynitride film was formed by a CVD method. Then, second CMP treatment was performed to polish the fifth silicon oxynitride film so that the surface of the fifth silicon oxynitride film was planarized.

Then, a 40-nm-thick sixth aluminum oxide film was formed over the fifth silicon oxynitride film by a sputtering method under the following conditions: the argon gas flow rate was 25 sccm, the oxygen gas flow rate was 25 sccm, the pressure was 0.4 Pa, and the substrate temperature was 250° C.

Then, third heat treatment was performed. The third heat treatment was performed in an atmosphere containing oxygen at 350° C. for one hour.

Next, a 100-nm-thick sixth silicon oxynitride film was formed by a CVD method.

Then, a contact hole reaching the second tungsten film (second gate electrode), a contact hole reaching the third tungsten film (first gate electrode), and a contact hole reaching the second tantalum nitride film (source electrode and drain electrode) were formed by a lithography method. A 40-nm-thick fourth tantalum nitride film was formed by a sputtering method, a 10-nm-thick third titanium nitride film was formed by an ALD method, and a 150-nm-thick fourth tungsten film was formed by a CVD method.

Then, the fourth tungsten film, the third titanium nitride film, and the fourth tantalum nitride film were polished to reach the sixth silicon oxynitride film by third CMP treatment, so that the fourth tungsten film, the third titanium nitride film, and the fourth tantalum nitride film were embedded in each contact hole to form plugs.

Next, a 50-nm-thick fifth tungsten film was formed by a sputtering method. Next, part of the fifth tungsten film was etched by a lithography method to form a wiring layer.

Next, fourth heat treatment was performed. The fourth heat treatment was performed at 250° C. for one hour.

Next, a 1.0-μm-thick photoresist film was formed by a coating method. Then, a portion of the photoresist film that is to be a measurement terminal (measurement pad) was removed by a lithography method.

Through the above process, the transistors 100 and 200 were fabricated.

Then, the electrical characteristics of the transistors 100 and 200 were measured. The transistors 100 were provided on a 5-inch-square substrate, and the transistors 200 were provided on a 5-inch-square substrate.

The electrical characteristics of the transistors 100 and 200 were measured by measuring change in source-drain current (hereinafter referred to as a drain current $I_d$) when a source-gate voltage (hereinafter referred to as a gate voltage $V_g$) changed from −4.0 V to +4.0 V at a source-drain voltage (hereinafter referred to as a drain voltage $V_d$) of 0.1 V or 1.2 V. That is, $I_d$-$V_g$ characteristics were measured. Hereinafter, the gate voltage $V_g$ refers to the voltage of a first gate electrode (top gate electrode). In this measurement, the voltage of a second gate electrode (back gate electrode) was set to 0 V. In this measurement, the $I_d$-$V_g$ characteristics of nine transistors on each substrate were measured.

From the obtained measurement data of the $I_d$-$V_g$ characteristics, Vsh values at $V_d$=0.1 V were calculated.

Figure 23A:
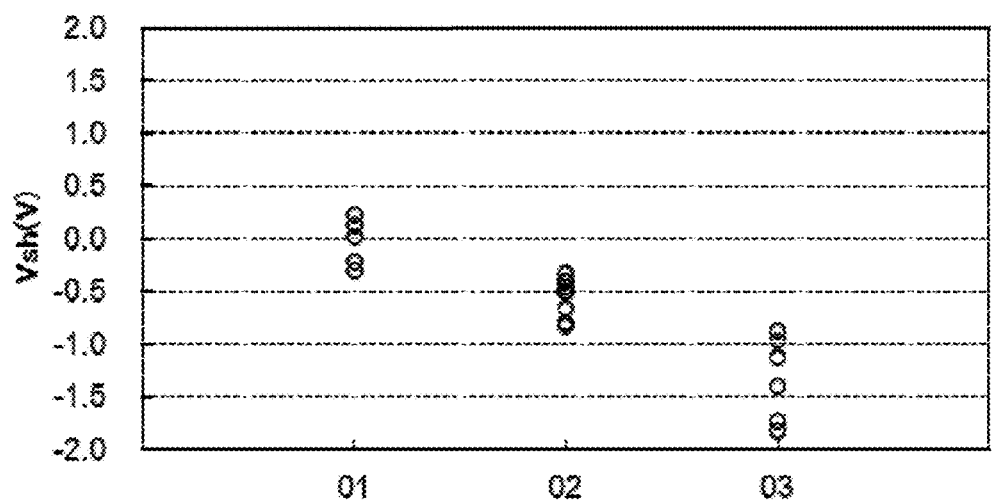
FIGS. 23A and 23B are graphs each showing the dependence of Vsh of a transistor of an example on the transistor density.
Figure 23B:
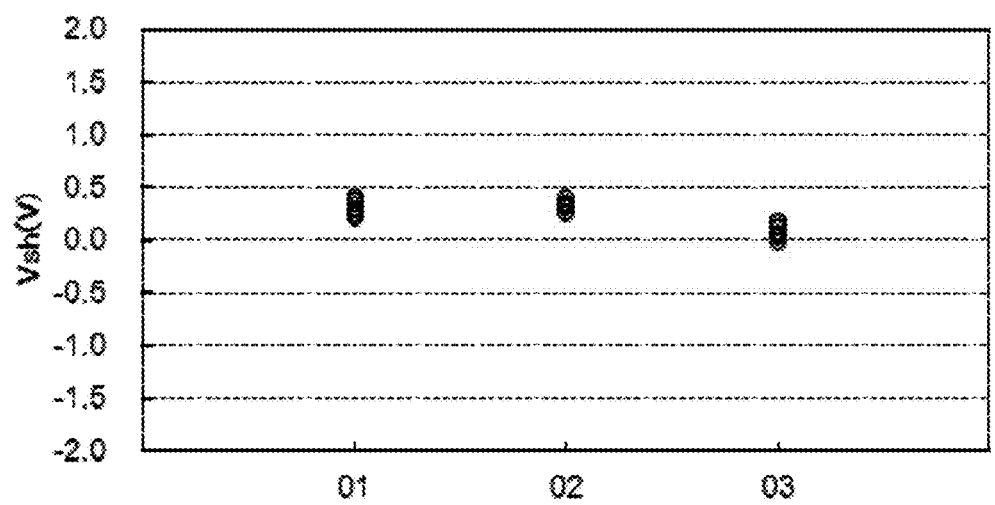

FIGS. 23A and 23B are graphs each showing the dependence of Vsh on the transistor density. Each transistor has a channel length of 60 nm and a channel width of 60 nm. In each graph, the vertical axis represents Vsh and the horizontal axis represents the transistor density. The transistor density is defined as the number of transistors per unit area. As for numbers on the horizontal axis, 01, 02, and 03 represent the transistor densities of 0.02/µm², 1/µm², and 2.9/µm², respectively.

FIG. 23A is a graph showing the dependence of Vsh of the transistor 100 on the transistor density. It is found from FIG. 23A that the Vsh value of the transistor 100 tends to shift in the negative direction as the transistor density increases. It is also found that variation in Vsh of the transistors is large at each transistor density. It is indicated that the structure of the transistor 100 causes dependence on the transistor density. FIG. 23B is a graph showing the dependence of Vsh of the transistor 200 on the transistor density. Variation in Vsh depending on the transistor density is small. In addition, variation in Vsh of transistors provided at the same density is also small. For example, variation, which is obtained by deducting the minimum Vsh value from the maximum Vsh value, is from approximately 0.14 V to approximately 0.20 V. As shown above, employing the structure of the transistor 200 can suppress variation in electrical characteristics of transistors regardless of the transistor density.

This application is based on Japanese Patent Application Serial No. 2016-169448 filed with Japan Patent Office on Aug. 31, 2016, the entire contents of which are hereby incorporated by reference.

What is claimed is:

1. A semiconductor device comprising:
a first transistor;
a second transistor;
a first metal oxide covering at least part of the first transistor;
an insulating film over the first transistor and the second transistor; and
a second metal oxide over the insulating film,
wherein the first transistor comprises:
a first gate electrode;
a first gate insulating film over the first gate electrode;
a first oxide over the first gate insulating film;
a first source electrode and a first drain electrode that are electrically connected to the first oxide;
a second gate insulating film over the first oxide; and
a second gate electrode over the second gate insulating film,
wherein the second transistor comprises:
a third gate electrode;
a third gate insulating film over the third gate electrode;
a second oxide over the third gate insulating film;
a second source electrode and a second drain electrode that are electrically connected to the second oxide;
a fourth gate insulating film over the second oxide; and
a fourth gate electrode over the fourth gate insulating film,
wherein the first gate insulating film and the second gate insulating film are in contact with the first metal oxide,
wherein the third gate insulating film and the fourth gate insulating film are in contact with the insulating film, and
wherein the insulating film comprises excess oxygen.

2. The semiconductor device according to claim 1, wherein the first metal oxide is configured to inhibit passage of oxygen.

3. The semiconductor device according to claim 1, wherein the first metal oxide and the second metal oxide each comprise aluminum and oxygen.

4. The semiconductor device according to claim 1, further comprising:
a first circuit; and
a second circuit,
wherein the first circuit comprises a plurality of the first transistors, and
wherein the second circuit comprises a plurality of the second transistors.

5. The semiconductor device according to claim 4, wherein a channel width of each of the plurality of the first transistors included in the first circuit is twice or more and 1000 times or less a channel length of each of the plurality of the first transistors.

6. The semiconductor device according to claim 4, wherein a channel length of each of the plurality of the first transistors included in the first circuit is twice or more and 1000 times or less a channel width of each of the plurality of the first transistors.

7. The semiconductor device according to claim 4, wherein a density of the plurality of the second transistors included in the second circuit is higher than or equal to 0.01/µm² and lower than or equal to 2500/µm².

8. The semiconductor device according to claim 4, wherein a density of the plurality of the first transistors included in the first circuit is lower than a density of the plurality of the second transistors included in the second circuit.

9. The semiconductor device according to claim 4, wherein a channel width of each of the plurality of the first transistors included in the first circuit is larger than a channel width of each of the plurality of the second transistors included in the second circuit.

10. The semiconductor device according to claim 4, wherein a channel length of each of the plurality of the first transistors included in the first circuit is longer than a channel length of each of the plurality of the second transistors included in the second circuit.

11. A semiconductor device comprising:
a first transistor;
a second transistor;
a first metal oxide covering at least part of the first transistor and part of the second transistor;

an insulating film over the first transistor and the second transistor; and a second metal oxide over the insulating film, wherein the first transistor comprises:
- a first gate electrode;
- a first gate insulating film over the first gate electrode;
- a first oxide over the first gate insulating film;
- a first source electrode and a first drain electrode that are electrically connected to the first oxide;
- a second gate insulating film over the first oxide; and
- a second gate electrode over the second gate insulating film, wherein the second transistor comprises:
- a third gate electrode;
- a third gate insulating film over the third gate electrode;
- a second oxide over the third gate insulating film;
- a second source electrode and a second drain electrode that are electrically connected to the second oxide;
- a fourth gate insulating film over the second oxide; and
- a fourth gate electrode over the fourth gate insulating film, wherein the first gate insulating film is in contact with the insulating film, wherein the second gate insulating film is in contact with the first metal oxide and the insulating film, wherein the third gate insulating film and the fourth gate insulating film are in contact with the insulating film, and wherein the insulating film comprises excess oxygen.

12. The semiconductor device according to claim 2, wherein the first metal oxide is configured to inhibit passage of oxygen.

13. The semiconductor device according to claim 2, wherein the first metal oxide and the second metal oxide each comprise aluminum and oxygen.

14. The semiconductor device according to claim 2, further comprising:
a first circuit; and
a second circuit, wherein the first circuit comprises a plurality of the first transistors, and wherein the second circuit comprises a plurality of the second transistors.

15. The semiconductor device according to claim 14, wherein a channel width of each of the plurality of the first transistors included in the first circuit is twice or more and 1000 times or less a channel length of each of the plurality of the first transistors.

16. The semiconductor device according to claim 14, wherein a channel length of each of the plurality of the first transistors included in the first circuit is twice or more and 1000 times or less a channel width of each of the plurality of the first transistors.

17. The semiconductor device according to claim 14, wherein a density of the plurality of the second transistors included in the second circuit is higher than or equal to $0.01/\mu m^2$ and lower than or equal to $2500/\mu m^2$.

18. The semiconductor device according to claim 14, wherein a density of the plurality of the first transistors included in the first circuit is lower than a density of the plurality of the second transistors included in the second circuit.

19. The semiconductor device according to claim 14, wherein a channel width of each of the plurality of the first transistors included in the first circuit is larger than a channel width of each of the plurality of the second transistors included in the second circuit.

20. The semiconductor device according to claim 14, wherein a channel length of each of the plurality of the first transistors included in the first circuit is longer than a channel length of each of the plurality of the second transistors included in the second circuit.

* * * * *

UNITED STATES PATENT AND TRADEMARK OFFICE
CERTIFICATE OF CORRECTION

PATENT NO. : 9,978,879 B2
APPLICATION NO. : 15/685040
DATED : May 22, 2018
INVENTOR(S) : Yuta Endo Page 1 of 1

It is certified that error appears in the above-identified patent and that said Letters Patent is hereby corrected as shown below:

Column 47, Line 30, in Claim 12, after "claim" replace "2," with --11,--;

Column 47, Line 33, in Claim 13, after "claim" replace "2," with --11,--; and

Column 47, Line 36, in Claim 14, after "claim" replace "2," with --11,--.

Signed and Sealed this
Twenty-eighth Day of August, 2018

Andrei Iancu
*Director of the United States Patent and Trademark Office*